US010375482B2

(12) United States Patent
Inoue

(10) Patent No.: US 10,375,482 B2
(45) Date of Patent: Aug. 6, 2019

(54) CAPACITANCE TYPE TRANSDUCER AND ACOUSTIC SENSOR

(71) Applicant: OMRON Corporation, Kyoto (JP)

(72) Inventor: Tadashi Inoue, Shiga (JP)

(73) Assignee: OMRON Corporation, Kyoto (JP)

( * ) Notice: Subject to any disclaimer, the term of this patent is extended or adjusted under 35 U.S.C. 154(b) by 136 days.

(21) Appl. No.: 15/509,221

(22) PCT Filed: Mar. 10, 2016

(86) PCT No.: PCT/JP2016/057630
§ 371 (c)(1),
(2) Date: Mar. 7, 2017

(87) PCT Pub. No.: WO2016/143867
PCT Pub. Date: Sep. 15, 2016

(65) Prior Publication Data
US 2017/0289702 A1 Oct. 5, 2017

(30) Foreign Application Priority Data
Mar. 12, 2015 (JP) ................................ 2015-050100

(51) Int. Cl.
*B81B 7/00* (2006.01)
*H04R 19/04* (2006.01)
(Continued)

(52) U.S. Cl.
CPC .......... *H04R 19/04* (2013.01); *B81B 7/0029* (2013.01); *B81B 7/0061* (2013.01);
(Continued)

(58) Field of Classification Search
CPC combination set(s) only.
See application file for complete search history.

(56) References Cited

U.S. PATENT DOCUMENTS 8,111,871 B2 2/2012 Zhang et al.
8,692,340 B1 4/2014 Ata et al.
(Continued)

FOREIGN PATENT DOCUMENTS

CN 101242682 A 8/2008
CN 101374373 A 2/2009
(Continued)

OTHER PUBLICATIONS

Office Action in corresponding Korean Application No. 10-2017-7005904, dated Sep. 21, 2017 (6 pages).
(Continued)

*Primary Examiner* — Amir H Etesam
(74) *Attorney, Agent, or Firm* — Osha Liang LLP

(57) ABSTRACT

A capacitance type transducer has a substrate with an opening on a surface thereof, a back plate arranged to oppose the opening of the substrate, and a vibrating electrode film arranged to oppose the back plate across a gap between the vibrating electrode film and the back plate. The capacitance type transducer converts a displacement of the vibrating electrode film into a change in capacitance between the vibrating electrode film and the back plate. The capacitance type transducer has a pressure releasing flow channel which is an air flow channel formed by a gap between a part of the vibrating electrode film and a protruding portion integrally provided on the back plate.

27 Claims, 22 Drawing Sheets

(51) Int. Cl.
*B81C 1/00* (2006.01)
*H04R 7/12* (2006.01)
*H04R 19/00* (2006.01)
*H04R 31/00* (2006.01)

(52) U.S. Cl.
CPC .......... *B81C 1/00309* (2013.01); *H04R 7/12* (2013.01); *H04R 19/005* (2013.01); *H04R 31/00* (2013.01); *B81B 2201/0257* (2013.01); *B81B 2203/0127* (2013.01)

(56) References Cited

U.S. PATENT DOCUMENTS

| | | | |
|---|---|---|---|
| 8,737,171 | B2 | 5/2014 | Jenkins et al. |
| 9,695,038 | B2 * | 7/2017 | Cargill ................ H04R 19/005 |
| 2008/0175418 | A1 | 7/2008 | Zhang et al. |
| 2008/0192963 | A1 | 8/2008 | Sato |
| 2009/0060232 | A1 | 3/2009 | Hirade et al. |
| 2009/0175477 | A1 | 7/2009 | Suzuki et al. |
| 2009/0309171 | A1 | 12/2009 | Schrank |
| 2011/0108933 | A1 | 5/2011 | Nakatani |
| 2013/0069179 | A1 | 3/2013 | Ishimoto et al. |
| 2014/0084396 | A1 | 3/2014 | Jenkins et al. |
| 2014/0299948 | A1 | 10/2014 | Wang et al. |

FOREIGN PATENT DOCUMENTS

| | | | |
|---|---|---|---|
| CN | 103347808 | A | 10/2013 |
| CN | 104053104 | A | 9/2014 |
| JP | 2011-250170 | A | 12/2011 |
| KR | 10-2008-0006579 | | 1/2008 |
| KR | 10-2009-0015834 | | 2/2009 |
| WO | 2010-004766 | A1 | 1/2010 |

OTHER PUBLICATIONS

International Preliminary Report on Patentability issued in PCT/JP2016/057630, dated Sep. 12, 2017 (7 pages).

International Search Report issued in corresponding application No. PCT/JP2016/057630 dated May 10, 2016 (3 pages).

Written Opinion of the International Searching Authority issued in corresponding application No. PCT/JP2016/057630 dated May 10, 2016 (4 pages).

Office Action issued in Chinese Application No. 201680002574.X, dated Oct. 17, 2018 (25 pages).

* cited by examiner

CAPACITANCE TYPE TRANSDUCER AND ACOUSTIC SENSOR

CROSS-REFERENCE TO RELATED APPLICATIONS

This application is based upon and claims the benefit of priority of Japanese Patent Application No. 2015-050100, filed on Mar. 12, 2015, and International Patent Application No. PCT/JP2016/057630, filed on Mar. 10, 2016, the contents of which are incorporated herein by reference in their entirety.

BACKGROUND

Technical Field

The present application relates to a capacitance type transducer and to an acoustic sensor including the capacitance type transducer. More specifically, the present invention relates to a capacitance type transducer and an acoustic sensor constituted by a capacitor structure made up of a vibrating electrode film formed using MEMS technology and a back plate.

Related Art

Conventionally, small microphones have sometimes utilized an acoustic sensor called an ECM (Electret Condenser Microphone). However, since ECMs are sensitive to heat and microphones (hereinafter, also referred to as MEMS microphones) utilizing a capacitance type transducer manufactured using MEMS (Micro Electro Mechanical Systems) technology are superior in terms of readiness for digitization, downsizing, and the like, more MEMS microphones are recently being adopted (for example, refer to PTL 1).

Such capacitance type transducers include those using MEMS technology to realize a form where a vibrating electrode film which vibrates when subjected to pressure is arranged so as to oppose, across a gap, a back plate to which an electrode film is fixed. A capacitance type transducer in the form described above can be realized by a process involving, for example, after forming a vibrating electrode film and a sacrificial layer covering the vibrating electrode film on a silicon substrate, forming a back plate on top of the sacrificial layer and subsequently removing the sacrificial layer. Since MEMS technology applies semiconductor manufacturing technology in this manner, an extremely small capacitance type transducer can be obtained.

On the other hand, since a capacitance type transducer fabricated using MEMS technology is constituted by a thinned vibrating electrode film and a back plate, there is a risk that the vibrating electrode film may deform significantly and break when subjected to excessive pressure and the like. Such inconveniences may occur when, for example, high sound pressure is applied inside the capacitance type transducer as well as when air blowing is performed in a mounting process and when the capacitance type transducer is dropped.

While such inconveniences can conceivably be addressed by providing the vibrating electrode film with a hole for releasing pressure and releasing pressure from the hole when excessive pressure is applied, such a measure may cause a deterioration in frequency characteristics as a capacitance type transducer, particularly a decline in sensitivity in a low-frequency range.

In addition, a known invention of a MEMS transducer includes a vibrating electrode film and a plug section which is a section created by dividing and separating the vibrating electrode film with a slit, wherein the plug section is supported at a same height as other portions of the vibrating electrode film by a supporting structure with respect to a back plate or a substrate. In this invention, as the vibrating electrode film deforms in response to a difference in pressure between both sides of the film, a flow path between the vibrating electrode film and the plug section expands to release excessive pressure (for example, refer to PTL 2).

However, in the invention described above, since the plug section and a supporting member are separate members, the invention not only necessitates a more complicated manufacturing process but also entails a risk that the plug section may become detached from the supporting member and impair functionality. Therefore, the invention described above is unable to achieve sufficiently high reliability.

CITATION LIST

Patent Literature

[PTL 1] Japanese Patent Application Laid-open No. 2011-250170
[PTL 2] US Patent Specification No. 8737171
[PTL 3] US Patent Specification No. 8111871

SUMMARY

One or more embodiments of the present invention provides a technique enabling an excessive deformation of a vibrating electrode film to be suppressed and damage to the vibrating electrode film to be avoided when excessive pressure is applied to the vibrating electrode film, while maintaining favorably frequency characteristics during acoustic detection with a simpler configuration.

According to one or more embodiments of the present invention, in a capacitance type transducer which converts a displacement of a vibrating electrode film into a change in capacitance between the vibrating electrode film and a back plate, when the vibrating electrode film deforms under excessive pressure, the pressure applied to the vibrating electrode film is released by increasing a flow channel area of an air flow channel formed by a gap between a protruding portion integrally provided on the back plate and a part of the vibrating electrode film due to a relative movement of the protruding portion and the vibrating electrode film.

More specifically, the present invention provides a capacitance type transducer including:

a substrate with an opening on a surface thereof;

a back plate arranged to oppose the opening of the substrate; and a vibrating electrode film arranged to oppose the back plate across a gap between the vibrating electrode film and the back plate, the capacitance type transducer converting a displacement of the vibrating electrode film into a change in capacitance between the vibrating electrode film and the back plate, the capacitance type transducer further including a pressure releasing flow channel which is an air flow channel formed by a gap between a part of the vibrating electrode film and a protruding portion integrally provided on the back plate and which is configured to, when the vibrating electrode film deforms under pressure, release the pressure applied to the vibrating electrode film by increasing a flow channel area due to a relative movement of the vibrating electrode film and the protruding portion integrally provided on the back plate.

According to this configuration, for example, when excessive pressure is applied in the capacitance type transducer and the vibrating electrode film deforms significantly, the flow channel area of the pressure releasing flow channel increases due to a relative movement of the vibrating electrode film and the protruding portion integrally provided on the back plate. Consequently, when excessive pressure is applied in the capacitance type transducer and the vibrating electrode film deforms significantly, the pressure applied to the vibrating electrode film can be automatically released. As a result, damage to the vibrating electrode film due to excessive pressure can be suppressed.

In addition, according to this configuration, since the pressure releasing flow channel is formed by a gap between a part of the vibrating electrode film and a protruding portion integrally provided on the back plate, members themselves which inherently move when subjected to pressure can be utilized without modification and apparatus configuration can be simplified.

In addition, in the present invention, at least a part of a peripheral section of the back plate may bend to form a side surface and the back plate may be fixed to the substrate in a tip section of the side surface, the pressure releasing flow channel may be formed by a gap between an end surface of the vibrating electrode film and a protruding portion integrally formed on the side surface of the back plate, and when the vibrating electrode film deforms under pressure, the pressure applied to the vibrating electrode film may be released by increasing the gap between the end surface of the vibrating electrode film and the side surface of the back plate as the end surface of the vibrating electrode film and the protruding portion formed on the side surface of the back plate relatively move and deviate.

In other words, in this case, the back plate is coupled to the substrate as at least a part of the peripheral section of the back plate is bent to form a side surface and a tip section of the side surface is fixed to the substrate. In addition, the pressure releasing flow channel is formed by a gap between an end surface of the vibrating electrode film and the protruding portion integrally formed on the side surface of the back plate. Furthermore, when the vibrating electrode film deforms under pressure, as the end surface of the vibrating electrode film and the protruding portion formed on the side surface of the back plate relatively move and deviate, the gap between the end surface of the vibrating electrode film and the side surface of the back plate increases. As a result, the flow channel area of the pressure releasing flow channel increases and the pressure applied to the vibrating electrode film is released.

According to this configuration, by a simple configuration of, for example, bending outward the side surface of the back plate midway to form a protruding section opposing the end surface of the vibrating electrode film, damage to the vibrating electrode film when subjected to excessive pressure can be suppressed.

In addition, in the present invention, the protruding portion may be a protruding pillar structure, the pressure releasing flow channel may be formed by a gap between a hole provided in the vibrating electrode film and a protruding pillar structure integrally provided from the back plate to a side of the vibrating electrode film, at least a tip section of the protruding pillar structure may have a smaller diameter than a diameter of the hole and the protruding pillar structure may penetrate into the hole in a state prior to the vibrating electrode film deforming under pressure, and when the vibrating electrode film deforms under pressure, the pressure applied to the vibrating electrode film may be released as the vibrating electrode film and the protruding pillar structure of the back plate relatively move and the penetration of the protruding pillar structure into the hole is canceled.

In other words, in this case, the pressure releasing flow channel is formed by a gap between a hole provided in the vibrating electrode film and the protruding pillar structure integrally provided from the back plate to the side of the vibrating electrode film. In addition, at least a tip section of the protruding pillar structure has a smaller diameter than a diameter of the hole and the protruding pillar structure penetrates into the hole in a state prior to the vibrating electrode film deforming under pressure. Furthermore, when the vibrating electrode film deforms under pressure, the vibrating electrode film and the protruding pillar structure of the back plate relatively move and the protruding pillar structure withdraws from the hole to expose an entire surface of the hole. As a result, the pressure applied to the vibrating electrode film is released.

According to this configuration, in a state prior to the vibrating electrode film deforming under pressure, the penetration of the protruding pillar structure of the back plate into the hole of the vibrating electrode film enables leakage of air from the hole to be suppressed and frequency characteristics of an acoustic sensor to be preferably maintained in a more reliable manner. In addition, when the vibrating electrode film deforms by a prescribed amount due to being subjected to excessive pressure, since the protruding pillar structure of the back plate withdraws from the hole of the vibrating electrode film and the hole is released, the flow channel area of the pressure releasing flow channel is stably maintained at a small area until applied pressure reaches prescribed pressure and increases rapidly once the applied pressure reaches the prescribed pressure.

Therefore, the frequency characteristics of the capacitance type transducer can be maintained as favorably as possible until a last moment before the applied pressure reaches the prescribed pressure described above. In addition, once the applied pressure reaches the prescribed pressure, the pressure can be released at one time. Moreover, even in a state where the protruding pillar structure of the back plate withdraws from the hole of the vibrating electrode film and the hole is released, since air flowing into the hole passes through the gap between the vibrating electrode film and the protruding pillar structure integrally provided from the back plate to the side of the vibrating electrode film, the fact that the pressure releasing flow channel is formed by the gap between a part of the vibrating electrode film and the protruding portion integrally formed on the back plate remains unchanged. It should be noted that "penetration" in the above description indicates a state where the protruding pillar structure penetrates the hole of the vibrating electrode film and includes both a case where a tip of the protruding pillar structure reaches a surface on an opposite side of the vibrating electrode film or the tip further protrudes from the opposite side surface and a case where the tip of the protruding pillar structure stops at a midway point of a thickness of the vibrating electrode film.

In addition, in the present invention, the protruding portion may be a protruding pillar structure, the pressure releasing flow channel may be formed by a gap between a hole provided in the vibrating electrode film and a protruding pillar structure integrally provided from the back plate to a side of the vibrating electrode film, the protruding pillar structure may have a larger diameter than a diameter of the hole and a tip of the protruding pillar structure may cover the hole from a side of the back plate in a state prior to the vibrating electrode film deforming under pressure, and when the vibrating electrode film deforms under pressure, the pressure applied to the vibrating electrode film may be released as the vibrating electrode film and the protruding pillar structure of the back plate relatively move and the tip of the protruding pillar structure separates from the hole.

In other words, also in this case, the pressure releasing flow channel is formed by a gap between a hole provided in the vibrating electrode film and the protruding pillar structure integrally provided from the back plate to the side of the vibrating electrode film. In addition, a diameter of the protruding pillar structure is set larger than a diameter of the hole of the vibrating electrode film and a tip of the protruding pillar structure covers the hole of the vibrating electrode film from a side of the back plate in a state prior to the vibrating electrode film deforming under pressure. Furthermore, when the vibrating electrode film deforms under pressure, the vibrating electrode film and the protruding pillar structure of the back plate relatively move and the tip of the protruding pillar structure separates from the hole of the vibrating electrode film to enable air to readily flow into the hole. As a result, the pressure applied to the vibrating electrode film is released.

According to this configuration, in accordance with an amount of deformation of the vibrating electrode film from a state before deforming under pressure to a state of deforming under pressure, the flow channel area of the pressure releasing flow channel can be gradually increased. Therefore, an operation of the vibrating electrode film can be stabilized and reliability and durability of the apparatus in an environment where the apparatus is frequently subjected to excessive pressure can be improved.

In addition, in the present invention, in a state prior to the vibrating electrode film deforming under pressure, the protruding pillar structure may penetrate through the hole and the tip of the protruding pillar structure may be positioned on an opposite side of the vibrating electrode film to the back plate.

According to this configuration, instead of the protruding pillar structure of the back plate withdrawing from the hole of the vibrating electrode film immediately after the vibrating electrode film starts deforming, a certain pressure range or more in which the frequency characteristics of the capacitance type transducer is favorably maintainable can be secured. In addition, by appropriately setting a position of the tip of the pillar structure, a pressure value as a threshold to be applied when rapidly increasing the flow channel area of the pressure releasing flow channel can be appropriately set.

Furthermore, in the present invention, a diameter of the protruding pillar structure may increase from the tip of the pillar structure toward the back plate or may be constant. According to the former configuration, before the protruding pillar structure withdraws from the hole of the vibrating electrode film, the flow channel area of the protruding pillar structure can be gradually increased and a flow rate of air for releasing pressure can be gradually increased. Meanwhile, according to the latter configuration, before the protruding pillar structure withdraws from the hole of the vibrating electrode film, the flow channel area of the protruding pillar structure can be set constant and a flow rate of air for releasing pressure can be set constant until the protruding pillar structure withdraws from the hole. In this manner, variations of modes of releasing pressure until the protruding pillar structure withdraws from the hole of the vibrating electrode film can be expanded.

In addition, in the present invention, the protruding pillar structure may be formed by a film forming process which differs from that of the vibrating electrode film. Alternatively, the protruding pillar structure may be formed by a same film forming process as that of the back plate. By forming the protruding pillar structure in the same film forming process as that of the back plate, the manufacturing process can be simplified, integration of the protruding pillar structure and the back plate can be further enhanced, and reliability can be improved.

Furthermore, in the present invention, the vibrating electrode film may be fixed to the substrate at an anchor section and the vibrating electrode film may not be in contact with the substrate and the back plate at locations other than the anchor section. According to this configuration, a movement or a displacement of the vibrating electrode film can be made smoother and the operation of the capacitance type transducer can be further stabilized.

In addition, in the present invention, the back plate may have a plurality of perforations. Furthermore, the substrate may be arranged to avoid a portion opposing the protruding pillar structure integrally provided on the back plate. As a result, when penetration into the protruding pillar structure is canceled, pressure can be released more efficiently. Furthermore, in the present invention, the back plate may be arranged to oppose the substrate, the protruding pillar structure may be provided from the back plate toward a side of the substrate, and the tip of the protruding pillar structure may be positioned on a same plane as a surface of the substrate on the back plate side or further toward the back plate side than the surface. According to this configuration, the back plate and the protruding pillar structure can be more readily integrally formed on the substrate by film formation.

In addition, in the present invention, the back plate may have a stationary electrode film in a central section, and the protruding portion may be provided on an outer side of the stationary electrode film on the back plate. Accordingly, an area of the stationary electrode film can be secured and sensitivity of the transducer can be improved. Furthermore, in the present invention, the protruding portion may be provided in a central section of the back plate. Accordingly, the protruding portion is to be formed in a portion which deforms with higher sensitivity and, when the vibrating electrode film is subjected to large pressure, pressure can be released with higher sensitivity.

In addition, in the present invention, a side surface of the protruding pillar structure may form a tapered surface and an inclination angle of the tapered surface with respect to the back plate may be set to 60 degrees or more and 85 degrees or less. According to this configuration, stress concentration on the side surface of the protruding pillar structure can be suppressed and strength of the protruding pillar structure can be relatively increased. In addition, when depositing and forming the protruding pillar structure by a semiconductor manufacturing process, film quality itself of the side surface can be improved, which also contributes to increasing strength. Furthermore, for example, when the side surface of the protruding pillar structure is vertically formed, a decline in a state of film formation at a bottom of the protruding pillar structure and reduced film thickness of a film forming the bottom section may result in a decline in strength. However, by setting the inclination angle of the side surface of the protruding pillar structure to the range described above, such a decline in strength can be suppressed.

Furthermore, in the present invention, the vibrating electrode film may have an approximately rectangular shape and may be fixed at fixing sections provided in four corners of the vibrating electrode film, and the protruding portion may be provided at four locations in portions at the four corners of the vibrating electrode film which correspond to a further inner side than the fixing sections in a plan view on the back plate.

According to this configuration, since the protruding portion can be arranged on an outer side of the stationary electrode film of the back plate, an effect on acoustic performance can be suppressed without reducing an area of the stationary electrode film on the back plate. In addition, since the protruding portion is only formed in portions which are close to the fixing sections and which have a small amount of displacement of the vibrating electrode film, the protruding section is relatively less likely to withdraw from the pressure release hole and frequency characteristics can be maintained up to high sound pressure. Furthermore, a balance can be achieved between air pressure resistance and frequency characteristics and a degree of freedom of design can be increased.

In addition, in the present invention, the protruding portion may be provided at one location in a central section of the back plate. According to this configuration, since the protruding portion is only provided in a small number, a variation in frequency characteristics can be reduced. Furthermore, since the protruding portion is only formed in the central section where the amount of displacement of the vibrating electrode film is large, the protruding portion is more readily withdrawn from the pressure release hole and the pressure releasing function can even be exhibited under low pressure. In addition, even when the substrate overlaps with the vibrating electrode film and the back plate in a plan view, a distance between a center-side end surface of the substrate and the protruding portion can be increased and an effect of overlapping can be suppressed.

Furthermore, in the present invention, the protruding portion may be further provided at four locations in portions of the back plate, which correspond to central sections of four sides of the vibrating electrode film in a plan view, so as to be provided at a total of eight locations. According to this configuration, the flow channel area of the pressure releasing flow channel can be increased as a whole and air pressure resistance can be improved. In addition, since the protruding portion does not withdraw from the hole until large pressure is applied, frequency characteristics can be maintained even under high sound pressure. Furthermore, since the protruding portion is installed so as to avoid the central section of the back plate, warpage deformation of the back plate can be reduced. In addition, an effect on acoustic performance can be suppressed without reducing an area of the stationary electrode film on the back plate in a portion where the amount of displacement of the vibrating electrode film is large.

Furthermore, in the present invention, the protruding portion may be further provided at one location in the central section of the back plate so as to be provided at a total of nine locations. According to this configuration, air pressure resistance can be further improved. In addition, since the protruding portion does not withdraw from the hole until large pressure is applied, frequency characteristics can be maintained even under high sound pressure (advantageous to use under high sound pressure).

In addition, in the present invention, in a state where the protruding pillar structure has penetrated into the hole before the vibrating electrode film deforms under pressure where, the gap between the protruding strip pillar structure and the hole may be set to 0.2 μm or more and 20 μm or less on one side. According to this configuration, a favorable balance can be achieved between an amount of attenuation in a low-frequency region in frequency characteristics as acoustic characteristics and a risk of contact between the protruding portion and the hole.

Furthermore, in the present invention, the back plate may include the stationary electrode film positioned to avoid a location where the protruding portion is provided in a plan view, and a distance between the protruding strip portion and the stationary electrode film may be set to 1 μm or more and 15 μm or less. According to this configuration, a favorable balance can be achieved between a loss reduction effect of an electrode area of the stationary electrode film by providing the protruding portion and a risk of short-circuit when conductive foreign objects infiltrate a vicinity of the protruding portion.

In addition, in the present invention, a size of the gap between the back plate and the vibrating electrode film may be set larger within a prescribed range in a periphery of the protruding portion, as compared to outside of the prescribed range. According to this configuration, when conductive foreign objects infiltrate a vicinity of the protruding portion, an amount of displacement of the vibrating electrode film due to the foreign objects can be reduced and an effect on frequency characteristics as acoustic characteristics can be reduced.

Moreover, in the present invention, a size of a sound hole in the back plate may be set smaller within a prescribed range in a periphery of the protruding portion, as compared to outside of the prescribed range. According to this configuration, a probability of infiltration by foreign objects from sound holes in the vicinity of the protruding portion can be reduced and a probability of foreign objects becoming deposited or getting caught in the vicinity of the protruding portion of the back plate can be reduced.

In addition, in the present invention, a sound hole within a prescribed range in a periphery of the protruding portion of the back plate and a hole provided in the vibrating electrode film may be arranged so that at least parts thereof overlap with each other in a plan view. According to this configuration, a space penetrating through both the vibrating electrode film and the back plate can be formed in a periphery of the protruding portion and foreign objects can more readily pass through this space. As a result, the probability of foreign objects becoming deposited or getting caught in the vicinity of the protruding portion of the back plate can be reduced.

Furthermore, the present invention may be an acoustic sensor which includes the capacitance type transducer described above, wherein the acoustic sensor converts sound pressure into a change in capacitance between the vibrating electrode film and the back plate and detects the capacitance change. According to this configuration, with respect to the acoustic sensor, damage to the vibrating electrode film can be avoided when excessive pressure is applied to the vibrating electrode film by suppressing excessive deformation of the vibrating electrode film, while maintaining favorably frequency characteristics during acoustic detection. As a result, an acoustic sensor with favorable frequency characteristics and high reliability can be obtained.

Moreover, means for solving the problem described above can be used in various combinations as appropriate.

Advantageous Effects of Invention

According to the present invention, with respect to a capacitance type transducer, damage to a vibrating electrode film can be avoided when excessive pressure is applied to the vibrating electrode film by suppressing excessive deformation of the vibrating electrode film, while maintaining favorably frequency characteristics during detection of pressure. As a result, reliability of the capacitance type transducer can be improved, while maintaining more favorably performance thereof.

DETAILED DESCRIPTION

First Embodiment

Hereinafter, embodiments of the invention of the present application will be described with reference to the drawings. The embodiments described below merely represent aspects of the invention of the present application and are not intended to limit the technical scope of the present invention. While the invention of the present application can be applied to all electrostatic transducers, a case where an electrostatic transducer is used as an acoustic sensor will be described below. However, a sound transducer according to the present invention can be used as sensors other than an acoustic sensor as long as a displacement of a vibrating electrode film can be detected. For example, in addition to a pressure sensor, a sound transducer according to the present invention may be used as an acceleration sensor, an inertial sensor, and the like. In addition, a sound transducer according to the present invention may be used as elements other than a sensor such as a speaker which converts an electrical signal into a displacement.

Figure 1:
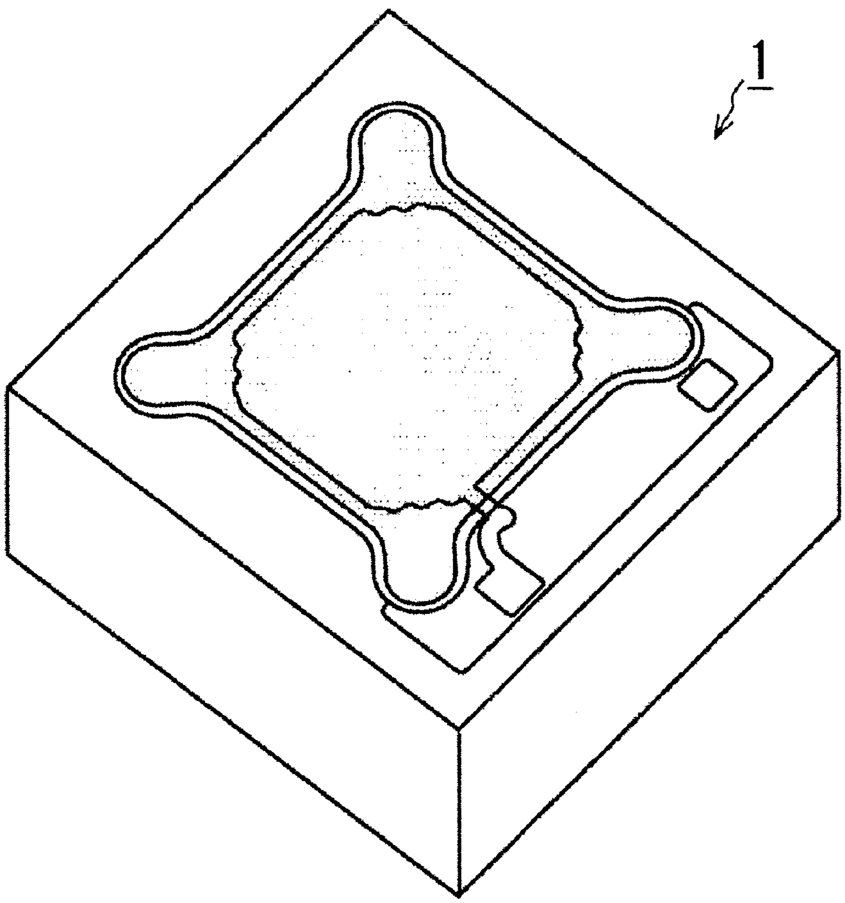
FIG. 1 is a perspective view showing an example of a conventional acoustic sensor manufactured using MEMS technology.
Figure 2:
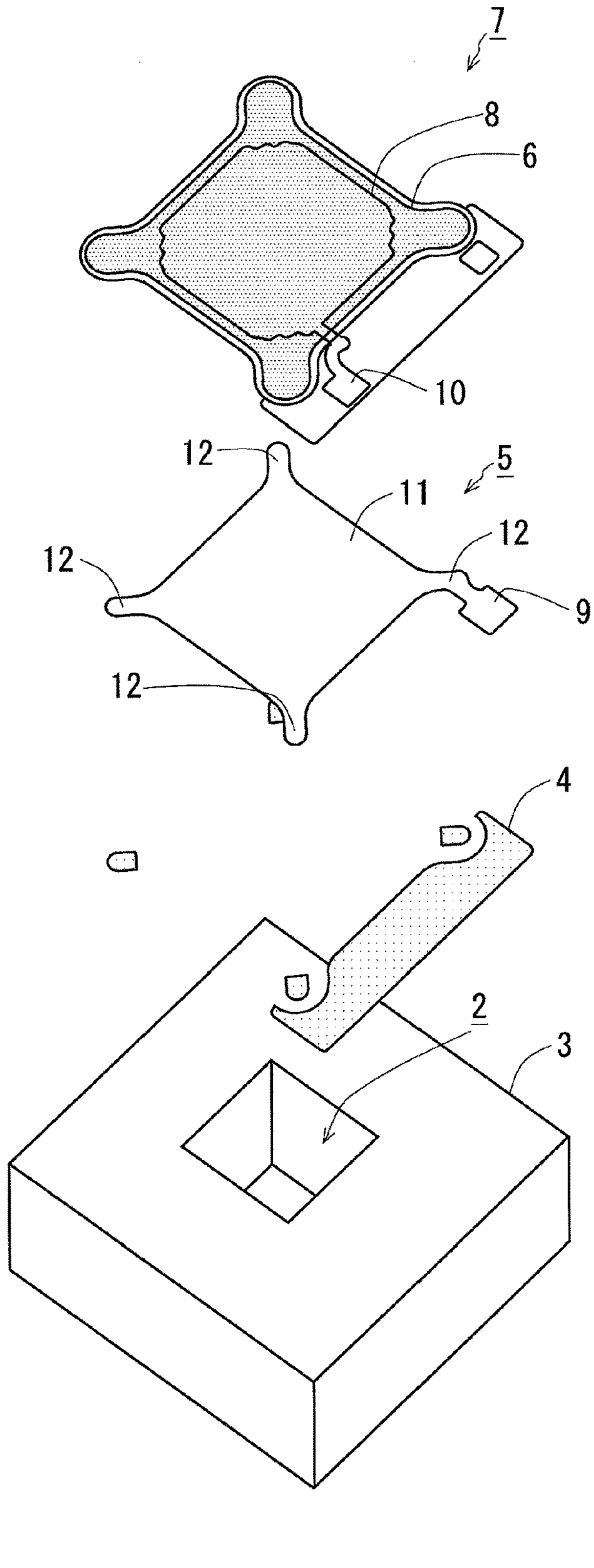
FIG. 2 is an exploded perspective view showing an example of an internal structure of a conventional acoustic sensor.

FIG. 1 is a perspective view showing an example of a conventional acoustic sensor 1 manufactured using MEMS technology. In addition, FIG. 2 is an exploded perspective view showing an example of an internal structure of the acoustic sensor 1. The acoustic sensor 1 is a laminated body in which an insulating film 4, a vibrating electrode film (a diaphragm) 5, and a back plate 7 are stacked on an upper surface of a silicon substrate (a substrate) 3 provided with a back chamber 2. The back plate 7 is structured such that a stationary electrode film 8 is formed on a fixing plate 6, and the stationary electrode film 8 is arranged on a side of the silicon substrate 3 of the fixing plate 6. Sound holes as a large number of perforations are provided over an entire surface of the fixing plate 6 of the back plate 7 (each point in hatchings applied to the fixing plate 6 shown in FIGS. 1 and 2 corresponds to each sound hole). In addition, a stationary electrode pad 10 for acquiring an output signal is provided at one of four corners of the stationary electrode film 8.

In this case, the silicon substrate 3 can be formed of, for example, single crystal silicon. In addition, the vibrating electrode film 5 can be formed of, for example, conductive polycrystalline silicon. The vibrating electrode film 5 is a thin film with an approximately rectangular shape, and a fixing section 12 is provided at four corners of an approximately quadrilateral vibrating section 11 which vibrates. Furthermore, the vibrating electrode film 5 is arranged on the upper surface of the silicon substrate 3 so as to cover the back chamber 2 and is fixed to the silicon substrate 3 at the four fixing sections 12 as anchor sections. The vibrating section 11 of the vibrating electrode film 5 vibrates up and down in reaction to sound pressure.

In addition, the vibrating electrode film 5 contacts neither the silicon substrate 3 nor the back plate 7 at locations other than the four fixing sections 12. Therefore, the vibrating electrode film 5 is capable of vibrating up and down more smoothly in response to sound pressure. Furthermore, a vibrating film electrode pad 9 is provided in one of the fixing sections 12 located at the four corners of the vibrating section 11. The stationary electrode film 8 provided on the back plate 7 is provided so as to correspond to a vibrating portion of the vibrating electrode film 5 excluding the fixing sections 12 at the four corners. This is because the fixing sections 12 at the four corners of the vibrating electrode film 5 do not vibrate in response to sound pressure and capacitance between the vibrating electrode film 5 and the stationary electrode film 8 does not change.

When sound reaches the acoustic sensor 1, the sound passes through the sound holes and applies sound pressure to the vibrating electrode film 5. In other words, the sound holes enable sound pressure to be applied to the vibrating electrode film 5. In addition, providing the sound holes enables air inside an air gap between the back plate 7 and the vibrating electrode film 5 to more readily escape outside and, consequently, thermal noise and noise can be reduced.

In the acoustic sensor 1, due to the structure described above, the vibrating electrode film 5 vibrates when receiving sound and a distance between the vibrating electrode film 5 and the stationary electrode film 8 changes. When the distance between the vibrating electrode film 5 and the stationary electrode film 8 changes, capacitance between the vibrating electrode film 5 and the stationary electrode film 8 changes. Therefore, by applying DC voltage between the vibrating film electrode pad 9 which is electrically connected to the vibrating electrode film 5 and the stationary electrode pad 10 which is electrically connected to the stationary electrode film 8 and extracting a change in the capacitance as an electrical signal, sound pressure can be detected as an electrical signal.

Figure 3:
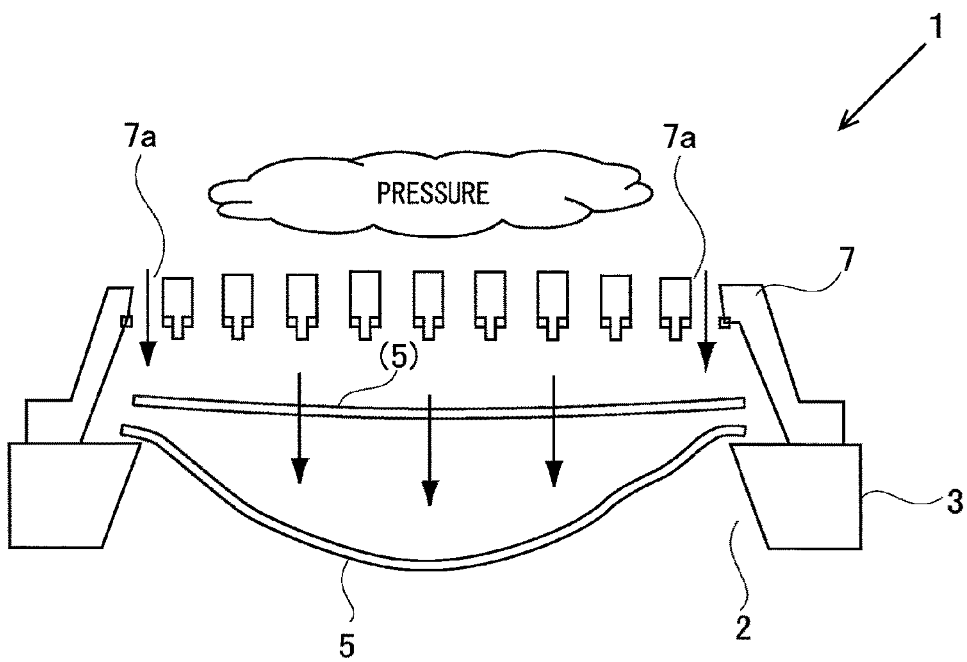
FIG. 3 is a diagram for explaining a case where excessive pressure is abruptly applied to an acoustic sensor.

Next, an inconvenience which may occur in the conventional acoustic sensor 1 described will be explained. FIG. 3 is a schematic diagram illustrating a case where excessive pressure is applied to the acoustic sensor 1. As shown in FIG. 3, when excessive pressure is applied to the acoustic sensor 1, due to large pressure acting on the vibrating section 11 of the vibrating electrode film 5 through sound holes 7*a* provided on the back plate 7, a large distortion may occur at the vibrating section 11 and the vibrating electrode film 5 may break. For example, such inconveniences may occur when the acoustic sensor 1 is subjected to excessive air pressure as well as when the acoustic sensor 1 is dropped or the like.

Figure 4A:
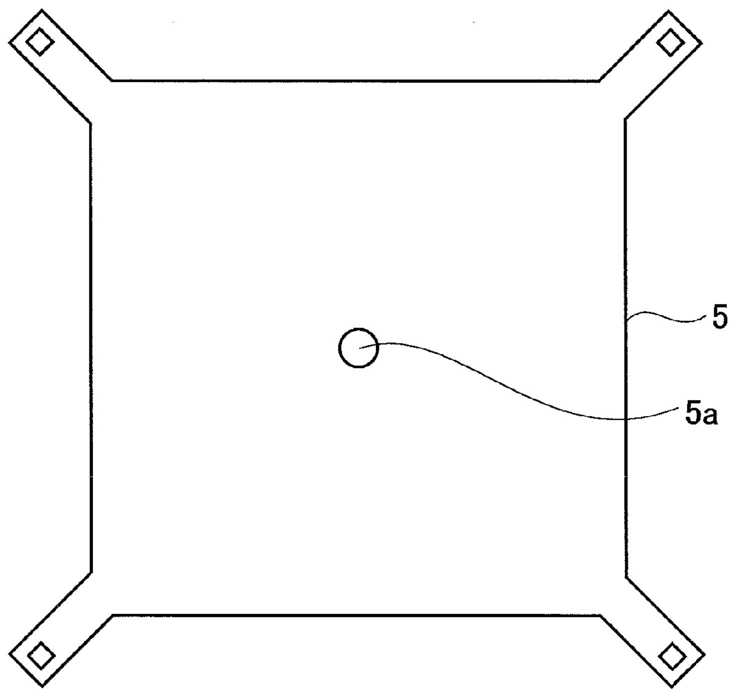
FIGS. 4A and 4B are diagrams for explaining a conventional measure taken in a case where excessive pressure is abruptly applied to an acoustic sensor.
Figure 4B:
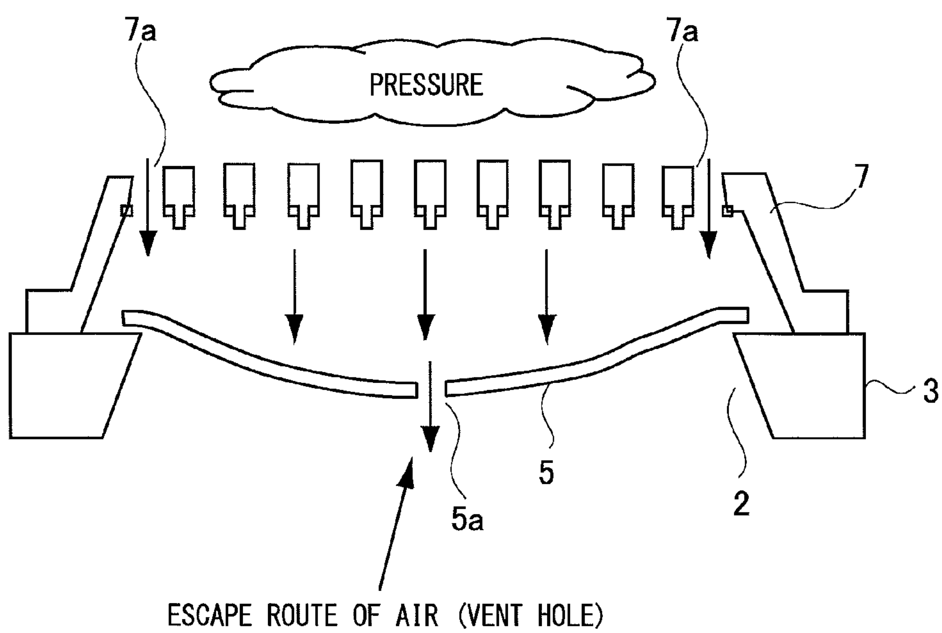

Measures such as that shown in FIGS. 4A and 4B are conceivable in response to such inconveniences. Specifically, as shown in FIG. 4A, by providing the vibrating electrode film 5 with a hole 5*a* for releasing applied pressure, when excessive pressure is applied from the sound holes 7*a* of the back plate 7 of the acoustic sensor 1, damage to the vibrating electrode film 5 can be prevented by releasing pressure from the hole 5*a* as shown in FIG. 4B. However, while providing the vibrating electrode film 5 with the abovementioned hole 5*a* which is constantly open improves resistance to pressure, an inconvenience is created in that the acoustic sensor 1 becomes more susceptible to a decline in sensitivity in particularly a low-frequency range or, in other words, a roll-off and, consequently, frequency characteristics of the acoustic sensor 1 deteriorate.

Another conceivable measure involves providing a vibrating electrode film and a plug section which is a section created by dividing and separating the vibrating electrode film with a slit, and supporting the plug section at a same height as other portions of the vibrating electrode film by a supporting structure with respect to a back plate. According to this measure, as the vibrating electrode film deforms in response to a difference in pressure between both sides of the film, a flow channel between the vibrating electrode film and the plug section expands and releases excessive pressure (for example, refer to PTL 2).

However, this measure entails the following inconveniences. First, since the plug section is constructed using a section of the extremely thin vibrating electrode film, the plug section is susceptible to damage. In addition, since a lid-shaped plug section is supported by a supporting structure made of separate rod-like members with respect to the back plate, not only does the manufacturing process become complicated but there is also a risk that the plug section may break off or become detached from the supporting structure.

Furthermore, according to this measure, as the vibrating electrode film deforms in response to a difference in pressure between both sides of the film, a flow path between the vibrating electrode film and the plug section which is a section created by dividing and separating the vibrating electrode film with a slit expands and releases excessive pressure. Specifically, since a gap between two thin films, namely, the vibrating electrode film and the plug section which is a section created by dividing and separating the vibrating electrode film, is used as a flow channel, when an amplitude of the vibrating electrode film increases under relatively large pressure, there is a risk that positions of the plug section and the vibrating electrode film may deviate by their film thickness or more to create a state where the flow channel is somewhat enlarged and destabilize frequency characteristics of the acoustic sensor 1 even when the relatively large pressure is within a working pressure range.

In consideration of such inconveniences, in the present embodiment: the vibrating electrode film is provided with a hole for releasing applied pressure; in a state prior to deformation of the vibrating electrode film, a pillar structure which constitutes a part of the back plate and which is formed on a protruding shape penetrates through the hole and closes at least a part thereof; and in a state where the vibrating electrode film has deformed under pressure, a relative movement of the vibrating electrode film and the back plate causes the penetration through the hole by the pillar structure to be canceled and the entire hole to be exposed to release the pressure applied to the vibrating electrode film.

Figure 5A:
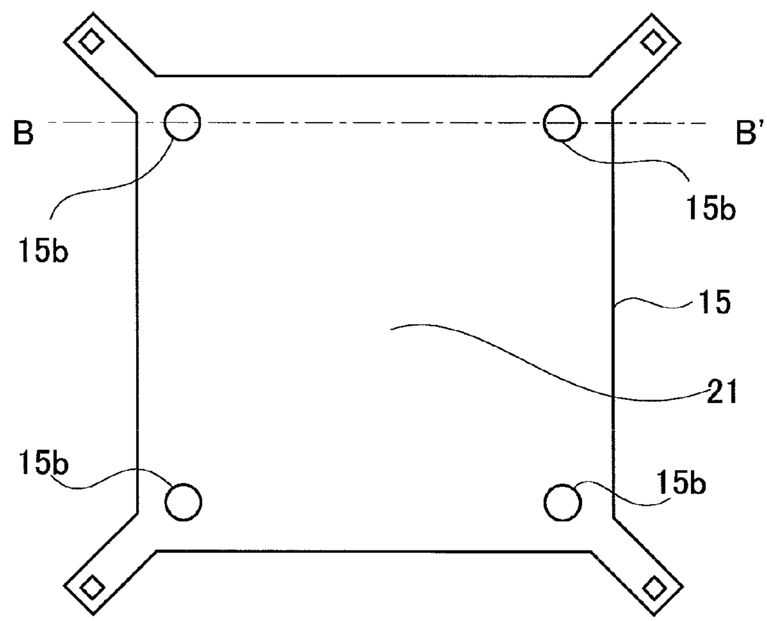
FIGS. 5A-5B are diagrams showing a vicinity of a vibrating electrode film and a back plate of an acoustic sensor according to a first embodiment of the present invention.
Figure 5B:
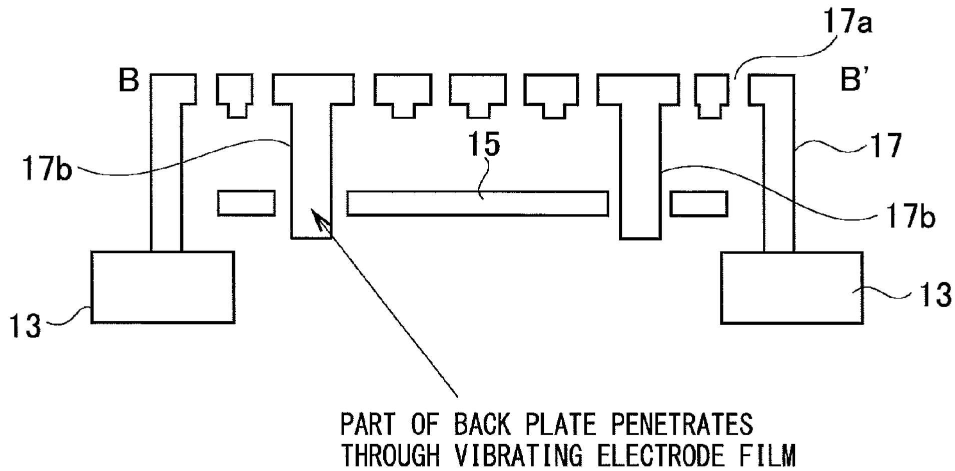

FIGS. 5A-5B show schematic views of a vicinity of a vibrating electrode film 15 and a back plate 17 of the acoustic sensor according to the present embodiment. FIG. 5A is a plan view of the vibrating electrode film 15 and FIG. 5B is a sectional view taken along a B-B' section of the vibrating electrode film 15, the back plate 17, and a substrate 13. As shown in FIG. 5A, in the present embodiment, a pressure release hole 15*b* is provided at four corners of a vibrating section 21 of the vibrating electrode film 15. In addition, as shown in FIG. 5B, a construction is adopted in which, in a state prior to excessive pressure being applied to the vibrating electrode film 15, a protruding section 17*b* which is a pillar structure integrally provided in a protruding shape on the back plate 17 penetrates through the pressure release hole 15*b* to close the pressure release hole 15*b*. Moreover, the protruding section 17*b* is a portion which is simultaneously formed as a part of the back plate 17 when the back plate 17 is formed by a semiconductor manufacturing process.

Figure 6A:
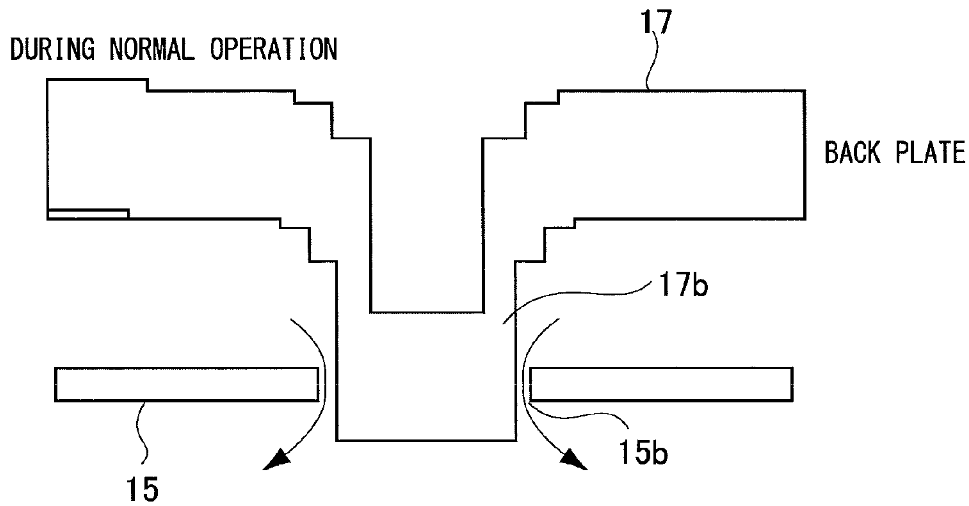
FIGS. 6A-6B are diagrams for explaining actions of a pressure release hole and a protruding section according to the first embodiment of the present invention.
Figure 6B:
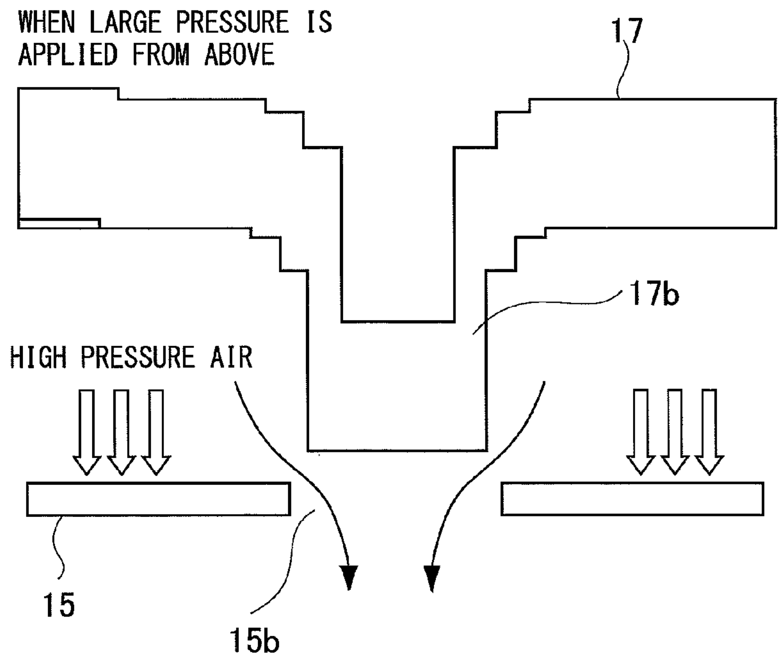

Next, actions of the pressure release hole 15*b* and the protruding section 17*b* described above will be explained with reference to FIGS. 6A-6B. FIG. 6A shows a state prior to excessive pressure being applied to the vibrating electrode film 15. FIG. 6B shows a state where, due to the application of excessive pressure on the vibrating electrode film 15, the vibrating electrode film 15 has deformed significantly. As shown in FIG. 6A, in the state prior to deformation of the vibrating electrode film 15, the protruding section 17*b* of the back plate 17 penetrates through the pressure release hole 15*b* provided in the vibrating electrode film 15 and closes the pressure release hole 15*b*. In this state, when pressure is applied to the vibrating electrode film 15 from the side of the back plate 17, an amount of air passing through the pressure release hole 15*b* is small and pressure is not sufficiently released.

However, when excessive pressure is applied to the vibrating electrode film 15, the pressure causes the vibrating electrode film 15 to deform significantly in a direction of separation from the back plate 17 as shown in FIG. 6B. As a result, the protruding section 17*b* withdraws from the pressure release hole 15*b* (penetration is canceled) and closure of the pressure release hole 15*b* is terminated. Accordingly, as air causing the pressure to be applied to the vibrating electrode film 15 moves toward a lower side in the diagram through the pressure release hole 15*b*, the pressure applied to the vibrating electrode film 15 is instantaneously released. As a result, further deformation of the vibrating electrode film 15 after the protruding section 17*b* withdraws from the pressure release hole 15*b* is suppressed and damage to the vibrating electrode film 15 can be avoided.

As described above, in the present embodiment, during normal operation or, in other words, when excessive pressure is not applied to the vibrating electrode film 15 and the vibrating electrode film 15 has not significantly deformed, since the protruding section 17*b* penetrates through and closes the pressure release hole 15*b*, deterioration of frequency characteristics of an acoustic sensor 1 can be suppressed. In addition, in a state where excessive pressure is applied to the vibrating electrode film 15 and the vibrating electrode film 15 has deformed significantly, since the protruding section 17*b* withdraws from the pressure release hole 15*b* (the penetration of the pressure release hole 15*b* by the protruding section 17*b* is canceled) and the closure is terminated, pressure can be sufficiently released from the pressure release hole 15*b*. As a result, further deformation of the vibrating electrode film 15 can be suppressed and damage to the vibrating electrode film 15 caused when excessive pressure is applied to the acoustic sensor 1 can be avoided.

Furthermore, in the present embodiment, since the functions described above are realized by utilizing a relative movement of a protruding section 17*b* integrally provided on the back plate 17 and the pressure release hole 15*b* provided in the vibrating electrode film 15, the structure can be simplified and reliability can be improved.

Figure 7A:
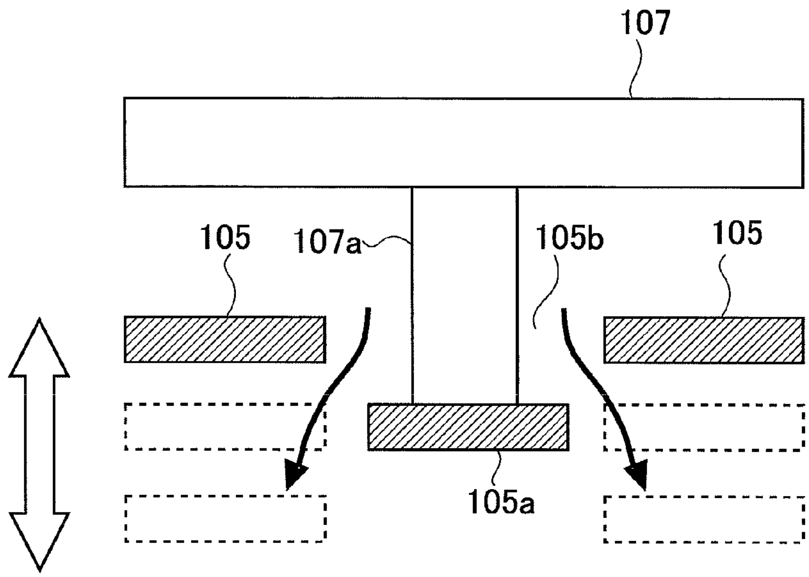
FIGS. 7A-7B are diagrams showing a difference in operational effects between conventional art which includes a vibrating electrode film and a plug section being a section created by dividing and separating the vibrating electrode film with a slit, the plug section being supported by a supporting structure with respect to a back plate and the first embodiment of the present invention.

In addition, FIGS. 7A-7B and 8A-8B show a difference in operational effects between conventional art which includes a vibrating electrode film 105 and a plug section 105*a* being a section created by dividing and separating the vibrating electrode film with a slit, the plug section 105*a* being supported by a supporting structure 107*a* with respect to a back plate 107 (for example, refer to PTL 2) and the present embodiment. FIG. 7A shows a case of the conventional art described above and FIG. 7B shows a case of the present embodiment.

As shown in FIG. 7A, according to the conventional art described above, since a gap between two thin films, namely, the vibrating electrode film 105 and the plug section 105*a* of which thickness is similar to that of the vibrating electrode film 105, is used to adjust between enabling and disabling the release of pressure, when relatively large pressure is applied and a displacement of the vibrating electrode film 105 becomes approximately equal to or larger than the film thickness, there is a risk that the gap between the plug section 105*a* and the vibrating electrode film 105 increases rapidly to cause deterioration of frequency characteristics (a decline in sensitivity at low frequencies) even when the relatively large pressure is within a working pressure range.

Figure 7B:
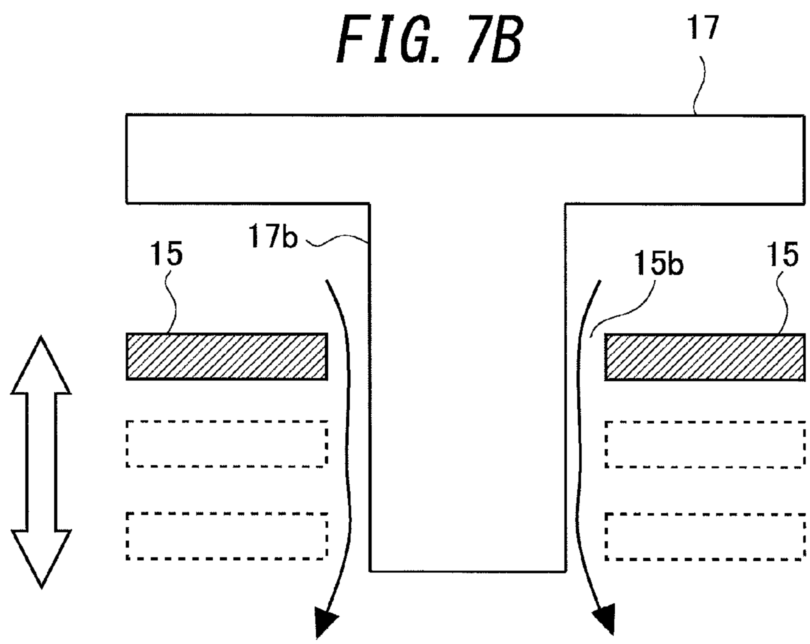

In contrast, according to the present embodiment, even when relatively large pressure is applied and a displacement of the vibrating electrode film 15 becomes approximately equal to or larger than the film thickness, as long as a state where the protruding section 17*b* penetrates through the vibrating electrode film 15 is maintained as shown in FIG. 7B, the gap between the vibrating electrode film 15 and the protruding section 17*b* remains approximately constant and frequency characteristics can be stabilized.

Figure 8A:
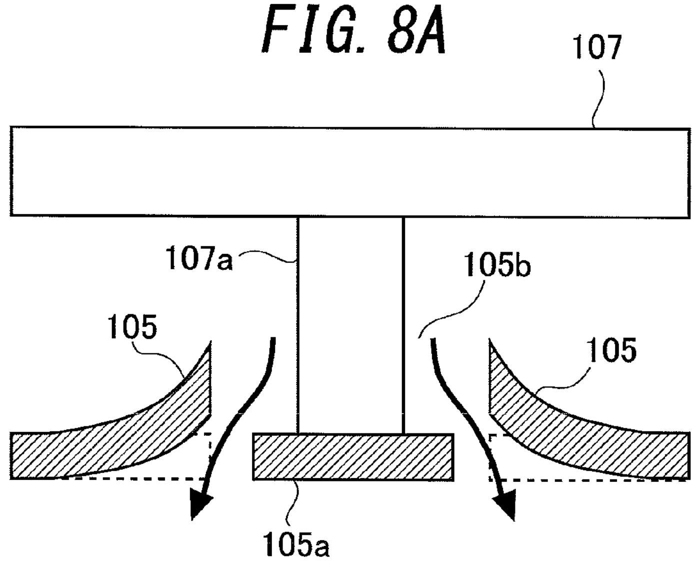
FIGS. 8A-8B are diagrams showing a difference in operational effects between conventional art which includes a vibrating electrode film and a plug section being a section created by dividing and separating the vibrating electrode film with a slit, the plug section being supported by a supporting structure with respect to a back plate and the first embodiment of the present invention.

In addition, as shown in FIG. 8A, according to the conventional art described above, when a vicinity of a pressure release hole 105*b* of the vibrating electrode film 105 warps and planarity deteriorates during a manufacturing process, the gap between the plug section 105*a* and the vibrating electrode film 105 may increase to cause deterioration of frequency characteristics (a decline in sensitivity at low frequencies) even during normal operation or, in other words, even in a state where excessive pressure is not applied to the vibrating electrode film 105 and the vibrating electrode film 105 has not deformed significantly.

Figure 8B:
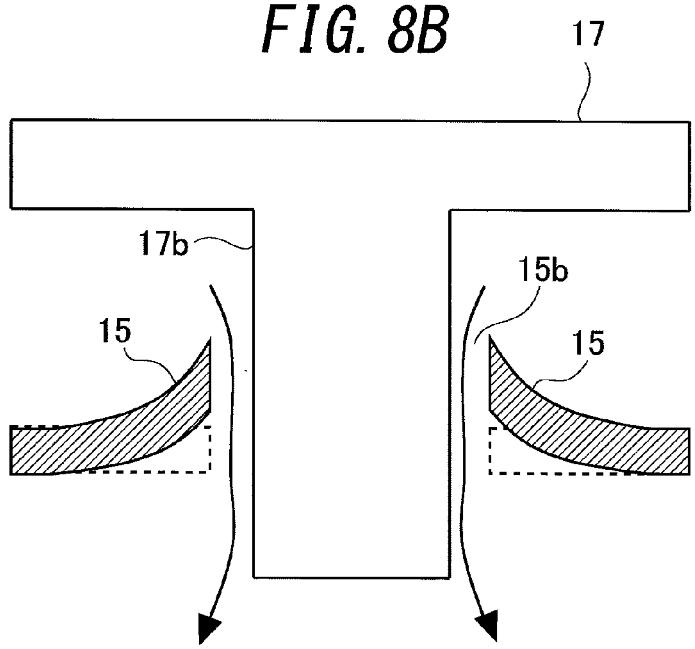

In contrast, according to the present embodiment, even when a vicinity of the pressure release hole 15*b* of the vibrating electrode film 15 warps and planarity deteriorates during a manufacturing process, as long as a state where the protruding section 17*b* penetrates through the vibrating electrode film 15 is maintained as shown in FIG. 8B, the gap between the vibrating electrode film 15 and the protruding section 17*b* remains approximately constant and frequency characteristics can be stabilized. In other words, according to the present embodiment, an effect of a variation in the manufacturing process on characteristics of the acoustic sensor 1 can be suppressed.

Furthermore, according to the conventional art described above, during actual operation, since a capacitor is not formed unless voltage is applied between the vibrating electrode film 105 and the back plate 107 and charge is accumulated, sound pressure is received while voltage is being applied between the vibrating electrode film 105 and the back plate 107. In other words, in an initial state where voltage is not applied, operation is performed in a state where the vibrating electrode film 105 as a whole is already attracted towards the side of the back plate 107. Therefore, overlapping of the plug section 105*a* and the peripheral vibrating electrode film 105 in a film thickness direction may become even smaller from the initial state and become unstable. Furthermore, another inconvenience is that a variation in applied voltage may cause the overlapping of the plug section 105*a* and the peripheral vibrating electrode film 105 in the film thickness direction to vary.

In contrast, according to the present embodiment, there are no inconveniences such as the overlapping of the plug section 105*a* and the peripheral vibrating electrode film 105 in the film thickness direction becoming unstable from an initial state or a variation in applied voltage causing the overlapping of the plug section 105*a* and the peripheral vibrating electrode film 105 in the film thickness direction to vary.

Figure 9:
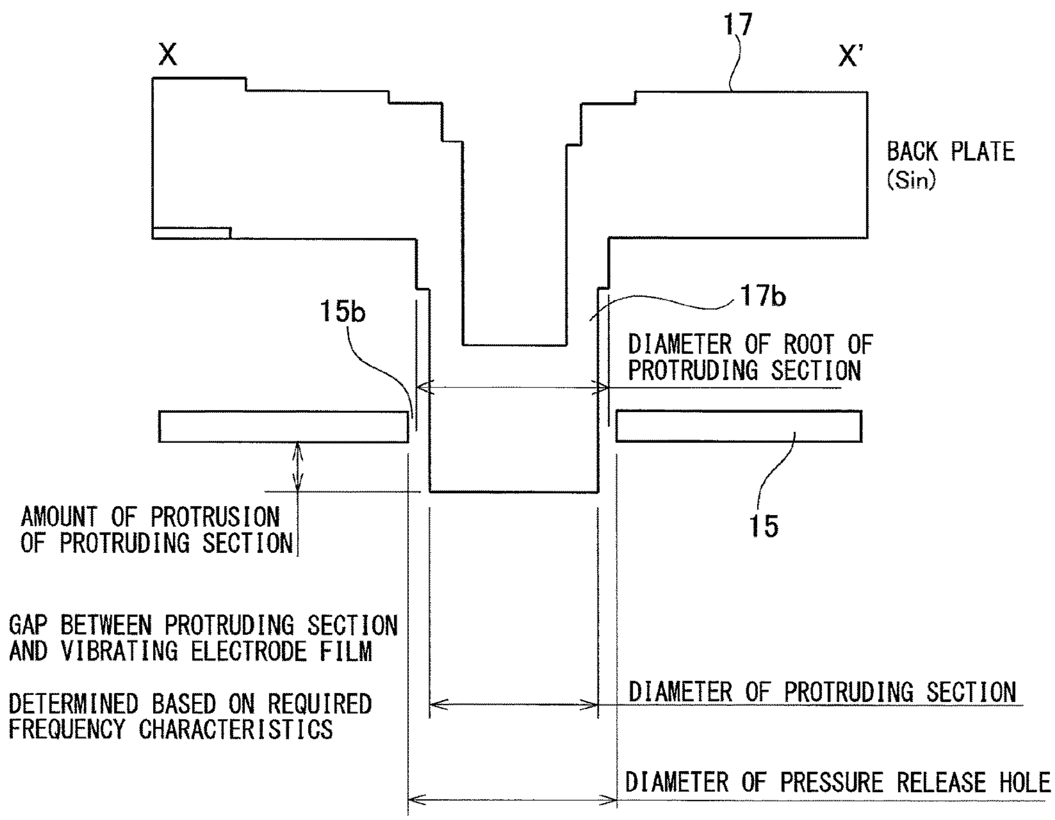
FIG. 9 is a diagram showing a dimensional relationship in a vicinity of a protruding section and a pressure release hole according to the first embodiment.

FIG. 9 shows a dimensional relationship in a vicinity of the protruding section 17*b* and the pressure release hole 15*b* according to the present embodiment. In the diagram, a size of a gap between the protruding section 17*b* and the pressure release hole 15*b* in a state where the protruding section 17*b* penetrates through the pressure release hole 15*b* can be changed in accordance with required frequency characteristics. In addition, an amount of protrusion of the tip of the protruding section 17*b* from the vibrating electrode film 15 is desirably equal to or more than ½ of the film thickness of the vibrating electrode film 15. Since the displacement of the vibrating electrode film 15 in a state of normal use is often equal to or less than ½ of the film thickness, when the amount of protrusion of the tip of the protruding section 17*b* from the vibrating electrode film 15 is within the range described above, a penetrated state of the pressure release hole 15*b* by the protruding section 17*b* can be maintained in a state where excessive pressure is not applied to the vibrating electrode film 15 and the vibrating electrode film 15 has not deformed significantly. More specifically, the amount of protrusion described above is desirably 0.1 μm or more and 10 μm or less.

In addition, in the acoustic sensor 1, the amount of protrusion described above is desirably larger than an amount of displacement of the vibrating electrode film 15 when maximum sound pressure within a working volume range is applied. According to this configuration, as long as the acoustic sensor 1 is used within the working volume range, stable frequency characteristics can be obtained. Furthermore, the penetration of the pressure release hole 15*b* by the protruding section 17*b* is desirably canceled when applied pressure is equal to or higher than 200 Pa. Accordingly, stable frequency characteristics of the acoustic sensor 1 can be obtained within a pressure range of lower than 200 Pa.

Moreover, in the present embodiment, when pressure is applied to the vibrating electrode film 15 from the side of the back plate 17, since the protruding section 17*b* withdraws from the pressure release hole 15*b* and the closure thereof is terminated as described earlier, an excessive deformation of the vibrating electrode film 15 can be prevented. On the other hand, when pressure is applied to the vibrating electrode film 15 from the side opposite to the back plate 17, since the vibrating electrode film 15 deforms in a direction approaching the back plate 17, the protruding section 17*b* does not withdraw from the pressure release hole 15*b*.

In this case, to be exact, the protruding section 17*b* has a truncated conic shape of which a diameter slightly increases toward the side of the back plate 17 and slightly decreases toward the side opposite to the back plate 17. Therefore, the gap between the protruding section 17*b* and the pressure release hole 15*b* is configured to widen when pressure is applied to the vibrating electrode film 15 from the side opposite to the back plate 17. According to this configuration, even when the protruding section 17*b* does not withdraw from the pressure release hole 15*b*, a level at which pressure is released from the pressure release hole 15*b* increases (a flow rate of air in the pressure release hole 15*b* increases) as the deformation of the vibrating electrode film 15 increases and acts to suppress deformation of the vibrating electrode film 15.

On the other hand, the gap between the protruding section 17*b* and the pressure release hole 15*b* is configured to conversely become narrower when pressure is applied to the vibrating electrode film 15 from the side opposite to the back plate 17. In this case, a diameter of a portion with a largest sectional area of the protruding section 17*b* or, in other words, a diameter of a root portion of the protruding section 17*b* is desirably smaller than the diameter of the pressure release hole 15*b*. Accordingly, even when excessive pressure is applied to the vibrating electrode film 15 and the vibrating electrode film 15 deforms significantly toward the side of the back plate 17, a situation where the protruding section 17*b* and the pressure release hole 15*b* come into contact with each other and inhibit the operation of the vibrating electrode film 15 can be prevented.

In addition, according to the present embodiment, when the vibrating electrode film 15 deforms significantly toward the side of the back plate 17, the vibrating electrode film 15 abuts with, and is supported by, the back plate 17 and further deformation of the vibrating electrode film 15 is suppressed. Therefore, in this case, damage to the vibrating electrode film 15 can be avoided even when the protruding section 17*b* does not withdraw from the pressure release hole 15*b* to terminate the closure of the pressure release hole 15*b*. Moreover, in the present embodiment, the shape of the protruding section 17*b* need not necessarily be a truncated conic shape as described above. For example, the protruding section 17*b* may have a columnar shape with an approximately constant diameter at any location thereof.

Moreover, in the present embodiment, in a state where excessive pressure is not applied to the vibrating electrode film 15 and the vibrating electrode film 15 has not significantly deformed, the gap between the protruding section 17*b* and a peripheral section of the pressure release hole 15*b* in a state where the protruding section 17*b* penetrates through the pressure release hole 15*b* functions as a pressure releasing flow channel. In addition, in a state where excessive pressure is applied to the vibrating electrode film 15 and the vibrating electrode film 15 has significantly deformed, the protruding section 17*b* has withdrawn from the pressure release hole 15*b* and the gap between the protruding section 17*b* and the vibrating electrode film 15 in this state and the pressure release hole 15*b* function as a pressure releasing flow channel. Furthermore, in the present embodiment, the protruding section 17*b* corresponds to the protruding portion and to the protruding pillar structure.

Figure 10:
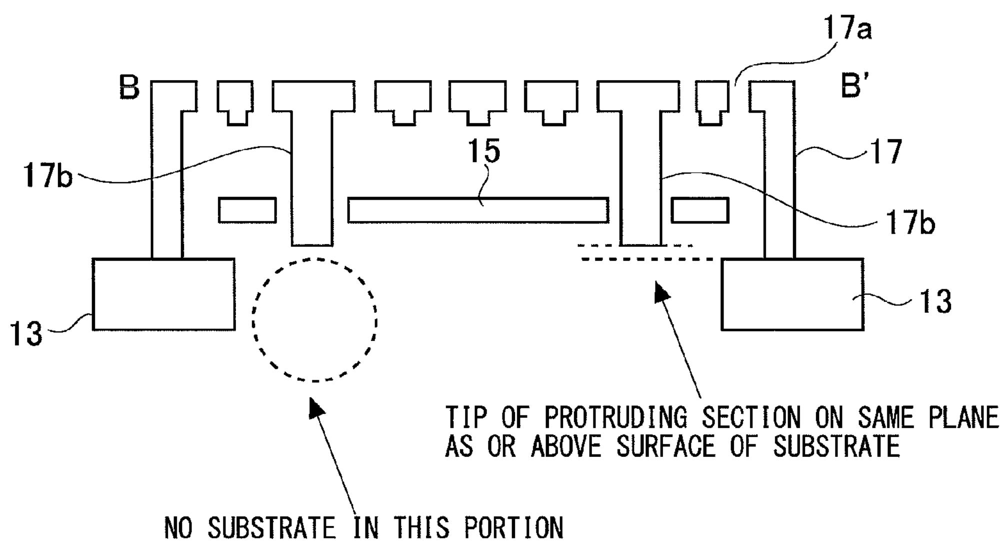
FIG. 10 is a diagram for explaining a relationship between a protruding section of a back plate and a silicon substrate according to the first embodiment.

Next, a relationship between the protruding section 17*b* and the silicon substrate 13 will be described with reference to FIG. 10. As shown in FIG. 10, desirably, the silicon substrate 13 is not present on a lower side of the protruding section 17*b*. In other words, the silicon substrate 13 is desirably arranged so as to avoid a portion opposing the protruding section 17*b* in the acoustic sensor. According to this configuration, air passing through the pressure release hole 15*b* can flow more smoothly and pressure can be more reliably released by the pressure release hole 15*b*. In addition, the tip of the protruding section 17*b* is desirably positioned on a same plane as or more on the side of the back plate of an upper side (back plate-side) surface of the silicon substrate 13. According to this configuration, by performing film formation on the silicon substrate 13, the back plate 17 provided with the protruding section 17*b* can be formed more reliably.

Moreover, the acoustic sensor according to the present embodiment can be realized by a process in which, after forming the vibrating electrode film 15 and a sacrificial layer covering the vibrating electrode film 15 on the silicon substrate 13, the back plate 17 and the protruding section 17*b* are formed on top of the sacrificial layer in the same process and the sacrificial layer is subsequently removed. Since the acoustic sensor according to the present embodiment applies semiconductor manufacturing technology in this manner, the acoustic sensor can be formed in an extremely small size and a positional relationship among the vibrating electrode film 15, the back plate 17, and the protruding section 17*b* can be formed with accuracy.

As described above, in the present embodiment, the protruding section 17*b* is formed by a film forming process which differs from that of the vibrating electrode film 15 and is formed by a same film forming process as that of the back plate 17. Therefore, the manufacturing process of the back plate 17 and the protruding section 17*b* can be simplified, integration of the protruding section 17*b* and the back plate 17 can be further enhanced, and reliability can be improved. This manufacturing process is roughly common to the embodiments described below. In addition, as shown in FIG. 9, the protruding section 17*b* according to the present embodiment may have a hollow pillar structure. However, the structure of the protruding section 17*b* is not limited to a hollow pillar structure. The structure of the protruding section 17*b* may be a solid pillar structure.

In addition, in the present embodiment, a case has been described in which, in a state where excessive pressure is not applied to the vibrating electrode film 15 and the vibrating electrode film 15 has not significantly deformed, the protruding section 17*b* penetrates through the pressure release hole 15*b* and the tip of the protruding section 17*b* protrudes from an opposite-side surface of the vibrating electrode film. Alternatively, in a state where excessive pressure is not applied to the vibrating electrode film 15 and the vibrating electrode film 15 has not significantly deformed, the protruding section 17*b* may only penetrate into the pressure release hole 15*b* and the tip of the protruding section 17*b* may not protrude from the surface on the opposite side of the vibrating electrode film.

In this case, the protruding section 17*b* more readily withdraws from the pressure release hole 15*b* due to a displacement of the vibrating electrode film 15 and a pressure range, in which the frequency characteristics of the acoustic sensor 1 can be favorably maintained, becomes smaller. Except for this disadvantage, an effect can be produced which is comparable to a case where, in a state where excessive pressure is not applied to the vibrating electrode film 15 and the vibrating electrode film 15 has not significantly deformed, the protruding section 17*b* penetrates through the pressure release hole 15*b* and the tip of the protruding section 17*b* protrudes from an opposite-side surface of the vibrating electrode film. In this case, a configuration may be adopted in which, in a state where excessive pressure is not applied to the vibrating electrode film 15 and the vibrating electrode film 15 has not significantly deformed, the tip of the protruding section 17*b* is positioned at center of the thickness of the vibrating electrode film 15. Accordingly, as long as pressure is within a certain pressure range, the tip of the protruding section 17*b* can be positioned within a range of the film thickness of the vibrating electrode film 15 and the positional relationship between the protruding section 17*b* and the pressure release hole 15*b* can be similarly maintained.

Second Embodiment

Next, a second embodiment according to the present invention will now be described. In the first embodiment, an example has been described in which, when the protruding section 17*b* penetrates through the pressure release hole 15*b* of the vibrating electrode film 15 to close the pressure release hole 15*b* and excessive pressure is applied to the vibrating electrode film 15, the penetration of the pressure release hole 15*b* by the protruding section 17*b* is canceled and the entire pressure release hole 15*b* is exposed.

In contrast, in the second embodiment, an example will be described in which a protruding section of a back plate covers a pressure release hole of a vibrating electrode film in a state of normal use prior to the vibrating electrode film deforming significantly and the protruding section separates from the pressure release hole when excessive pressure is applied to the vibrating electrode film.

Figure 11A:
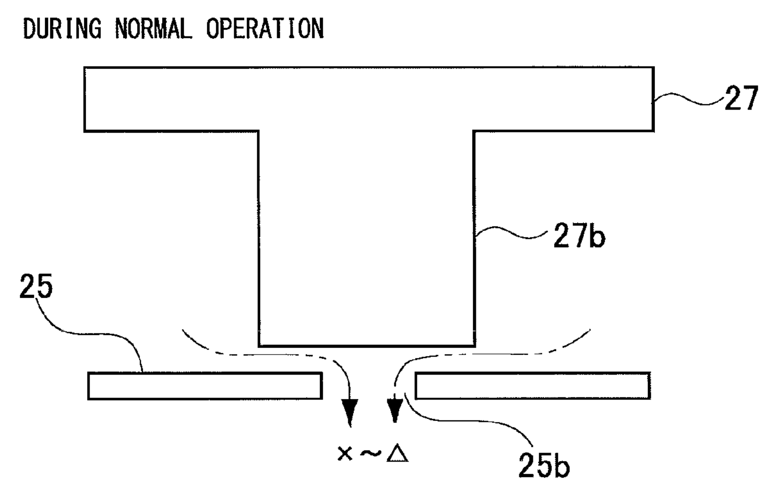
FIGS. 11A-11B are diagrams for explaining actions of a pressure release hole of a vibrating electrode film and a protruding section of a back plate according to a second embodiment of the present invention.
Figure 11B:
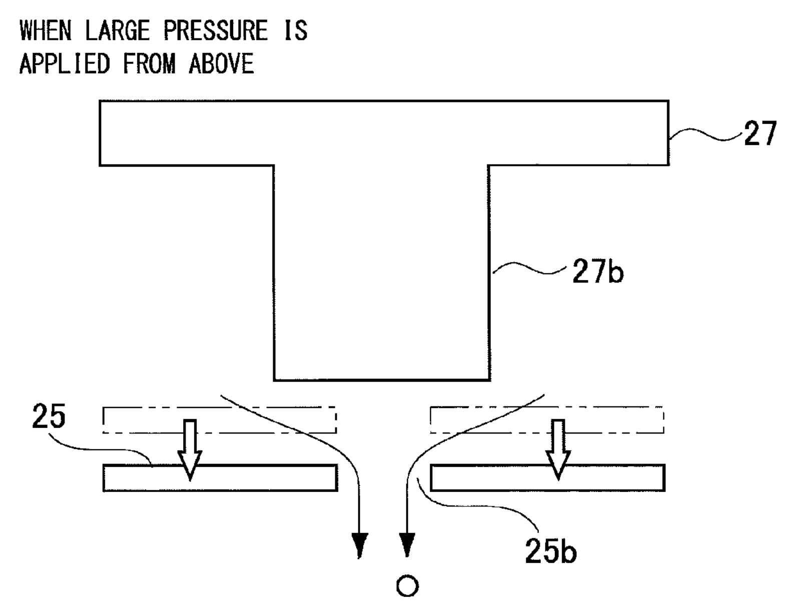

Actions of a pressure release hole 25*b* of a vibrating electrode film 25 and a protruding section 27*b* of a back plate 27 according to the present embodiment will be described with reference to FIGS. 11A-11B. FIG. 11A shows a state prior to excessive pressure being applied to the vibrating electrode film 25. FIG. 11B shows a state where, due to the application of excessive pressure on the vibrating electrode film 25, the vibrating electrode film 25 has deformed significantly. As shown in FIG. 11A, a diameter of the protruding section 27*b* of the back plate 27 according to the present embodiment is larger than a diameter of the pressure release hole 25*b* provided in the vibrating electrode film 25. In addition, in a state prior to excessive pressure being applied to the vibrating electrode film 25, the protruding section 27*b* of the back plate 27 covers the pressure release hole 25*b* from a side of the back plate 27.

In this state, when pressure is applied to the vibrating electrode film 25 from the side of the back plate 27, a gap between a tip of the protruding section 27*b* and the vibrating electrode film 25 is narrow and a flow channel of air is substantially closed. Therefore, an amount of air passing through the pressure release hole 25*b* is small and the pressure release hole 25*b* is substantially closed.

However, when excessive pressure is applied to the vibrating electrode film 25, the pressure causes the vibrating electrode film 25 to deform significantly in a direction of separation from the back plate 27 as shown in FIG. 11B. As a result, the gap between the tip of the protruding section 27*b* and the vibrating electrode film 25 increases and the closure of the pressure release hole 25*b* is substantially terminated. Accordingly, as air causing pressure to be applied to the vibrating electrode film 25 moves toward a lower side in the diagram through the pressure release hole 25*b*, the pressure being applied to the vibrating electrode film 25 is released.

As a result, further deformation of the vibrating electrode film 25 is suppressed and damage to the vibrating electrode film 25 can be avoided. Moreover, also in the present embodiment, desirably, a silicon substrate is not present on a lower side of the pressure release hole 25*b* or, in other words, a back chamber is desirably arranged on the lower side of the pressure release hole 25*b*. Accordingly, a flow channel in which air having passed through the pressure release hole 25*b* flows more smoothly is formed and pressure can be released more efficiently.

As described above, in the present embodiment, during normal operation or, in other words, when excessive pressure is not applied to the vibrating electrode film 25, since the tip of the protruding section 27*b* covers and closes the pressure release hole 25*b*, deterioration of frequency characteristics of an acoustic sensor can be suppressed. In addition, in a state where excessive pressure is applied to the vibrating electrode film 25 and the vibrating electrode film 25 has deformed significantly, since the protruding section 27*b* separates from the pressure release hole 25*b* and the closure is terminated, a further deformation of the vibrating electrode film 25 can be prevented. As a result, damage to the vibrating electrode film 25 caused when excessive pressure is applied to the acoustic sensor can be avoided. Moreover, in the present embodiment, the gap between the tip of the protruding section 27*b* and the vibrating electrode film 25, and the pressure release hole 25*b*, correspond to a pressure releasing flow channel. Furthermore, in the present embodiment, the protruding section 27*b* corresponds to the protruding portion and to the protruding pillar structure.

Third Embodiment

Next, a third embodiment according to the present invention will now be described. In the third embodiment, an example will be described in which a protruding section is provided on a side surface of a back plate and, when excessive pressure is applied to a vibrating electrode film, a gap between the protruding section and an end surface of the vibrating electrode film increases to release pressure.

Figure 12A:
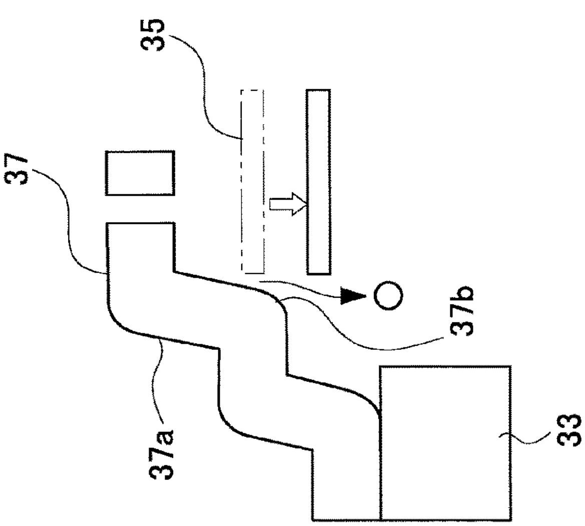
FIGS. 12A-12C are diagrams for explaining actions of a vibrating electrode film and a protruding section of a back plate according to a third embodiment of the present invention.
Figure 12B:
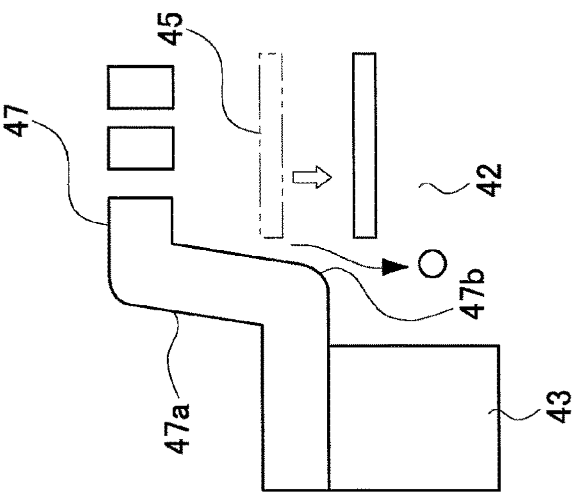
Figure 12C:
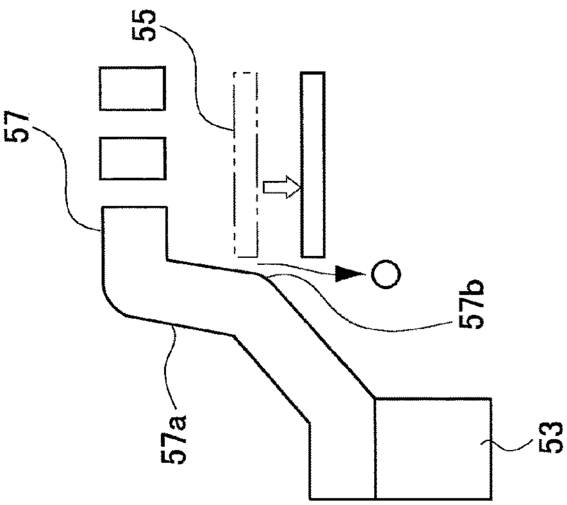

Actions of vibrating electrode films 35, 45, 55 and protruding sections 37*b*, 47*b*, and 57*b* of back plates 37, 47, and 57 according to the present embodiment will be described with reference to FIGS. 12A-12C. FIG. 12A is a diagram showing actions of the vibrating electrode film 35 and the protruding section 37*b* of the back plate 37 according to the present embodiment when excessive pressure is applied to the vibrating electrode film 35. FIG. 12B is a diagram showing actions of the vibrating electrode film 45 and the protruding section 47*b* of the back plate 47 according to the present embodiment when excessive pressure is applied to the vibrating electrode film 45. FIG. 12C is a diagram showing actions of the vibrating electrode film 55 and the protruding section 57*b* of the back plate 57 according to the present embodiment when excessive pressure is applied to the vibrating electrode film 55. In the respective diagrams, a vibrating electrode film depicted by a two-dot chain line indicates a vibrating electrode film not subjected to excessive pressure. In addition, a vibrating electrode film depicted by a solid line indicates a vibrating electrode film subjected to excessive pressure.

First, the example shown in FIG. 12A will be described. In this example, a peripheral section of the back plate 37 is bent to form a side surface 37*a* and a tip section of the side surface 37*a* is fixed to a substrate 33. In addition, the side surface 37*a* is structured so as to be bent in two steps, and the protruding section 37*b* is formed by a portion bent outward midway along the side surface 37*a*. Furthermore, in a state during normal operation in which excessive pressure is not applied, as depicted by a two-dot chain line in FIG. 12A, an end surface of the vibrating electrode film 35 is positioned on an upper side of the protruding section 37*b*. Therefore, a gap between the side surface 37*a* and the end surface of the vibrating electrode film 35 is narrow. As a result, a state exists where an area of a flow channel for releasing pressure is small.

In addition, when excessive pressure is applied to the vibrating electrode film 35, as depicted by a solid line in FIG. 12A, the vibrating electrode film 35 deforms and the position of the end surface of the vibrating electrode film 35 moves to a lower side of the protruding section 37*b*. Accordingly, the gap between the side surface 37*a* and the end surface of the vibrating electrode film 35 widens discontinuously and a state is created where the area of the flow channel for releasing pressure is sufficiently large. As a result, a further deformation of the vibrating electrode film 35 can be suppressed. Moreover, in FIG. 12A, the gap between the protruding section 37*b* of the side surface 37*a* and the vibrating electrode film 35 constitutes a pressure releasing flow channel.

Next, the example shown in FIG. 12B will be described. In this example, a peripheral section of the back plate 47 is bent to form a side surface 47*a* and a tip section of the side surface 47*a* is further bent outward and fixed to a substrate 43. In addition, the tip section of the side surface 47*a* is bent at a position protruding from the substrate 43 toward a side of a back chamber 42 to form the protruding section 47*b*. Furthermore, in a state during normal operation in which excessive pressure is not applied, as depicted by a two-dot chain line in FIG. 12B, an end surface of the vibrating electrode film 45 is positioned on an upper side of the protruding section 47*b*. Accordingly, the gap between the side surface 47*a* and the end surface of the vibrating electrode film 45 is narrow and a state is created where an area of a flow channel for releasing pressure is small.

In addition, when excessive pressure is applied to the vibrating electrode film 45, as depicted by a solid line in FIG. 12B, the vibrating electrode film 45 deforms and the position of the end surface thereof moves to a lower side of the protruding section 47*b*. Accordingly, the gap between the side surface 47*a* and the end surface of the vibrating electrode film 45 widens discontinuously and a state is created where the area of the flow channel for releasing pressure is sufficiently large. As a result, a further deformation of the vibrating electrode film 45 is suppressed. Moreover, in FIG. 12B, the gap between the protruding section 47*b* of the side surface 47*a* and the vibrating electrode film 45 constitutes a pressure releasing flow channel.

Next, the example shown in FIG. 12C will be described. In this example, a peripheral section of the back plate 57 is bent to form a side surface 57*a* and a tip section of the side surface 57*a* is fixed to a substrate 53. In addition, the side surface 57*a* is structured so as to be bent midway such that a lower side of a bent section has a larger taper angle as compared to an upper side of the bent section and that the side surface 57*a* is connected to the substrate 53 by the large taper angle. Furthermore, the protruding section 57*b* is formed by the bent section at which the taper angle changes midway along the side surface 57*a*. In this example, in a state during normal operation in which excessive pressure is not applied, as depicted by a two-dot chain line in FIG. 12C, an end surface of the vibrating electrode film 55 is positioned on an upper side of the protruding section 57*b*. Accordingly, the gap between the side surface 57*a* and the end surface of the vibrating electrode film 55 is narrow and a state is created where an area of a flow channel for releasing pressure is small.

In addition, when excessive pressure is applied to the vibrating electrode film 55, as depicted by a solid line in FIG. 12C, the vibrating electrode film 55 deforms and the position of the end surface thereof moves to a lower side of the protruding section 57*b*. Accordingly, the gap between the side surface 57*a* and the end surface of the vibrating electrode film 55 widens discontinuously and a state is created where the area of the flow channel for releasing pressure is sufficiently large. As a result, a further deformation of the vibrating electrode film 55 is suppressed. Moreover, in FIG. 12C, the gap between the protruding section 57*b* of the side surface 57*a* and the vibrating electrode film 55 constitutes a pressure releasing flow channel.

As described above, in the present embodiment, a protruding section is provided on a side surface of a back plate. In addition, during normal operation or, in other words, when a vibrating electrode film is not significantly deformed due to excessive pressure, since a gap between the protruding section and an end surface of the vibrating electrode film is narrow and a flow channel area of a pressure releasing flow channel is small, deterioration of frequency characteristics of an acoustic sensor can be suppressed. Furthermore, in a state where excessive pressure is applied to the vibrating electrode film and the vibrating electrode film deforms significantly, since the end surface of the vibrating electrode film and the protruding section relatively move and deviate in a vertical direction in the diagrams, the gap between the protruding section and the end surface of the vibrating electrode film increases discontinuously and the flow channel area of the pressure releasing flow channel increases discontinuously. Accordingly, a further deformation of the vibrating electrode film can be suppressed. As a result, damage to the vibrating electrode film caused when excessive pressure is applied to the acoustic sensor can be avoided.

Moreover, while examples in which the protruding section provided on the side surface of the back plate is formed by bending the side surface outward have been described above, a method of forming the protruding section is not limited thereto. The protruding section may be formed by increasing a thickness of the side surface of the back plate or, in other words, increasing a width of the side surface of the back plate in a horizontal direction. Furthermore, in the present embodiment, the protruding sections 37*b*, 47*b*, and 57*b* correspond to the protruding portion and to the protruding pillar structure.

In addition, examples have been described above in which at least a part of a peripheral section of the back plate is bent to forma side surface, the back plate is fixed to a substrate at a tip section of the side surface, and a protruding section is provided on the side surface. However, the side surface of the back plate according to the present invention is not limited to that formed by bending a part of the back plate. A side surface may be formed by a spacer which is a separate member at least in portions where a protruding section is not formed.

Fourth Embodiment

Next, a fourth embodiment according to the present invention will now be described. In the first embodiment, an example has been described in which, when the protruding section 17*b* penetrates through the pressure release hole 15*b* of the vibrating electrode film 15 to close the pressure release hole 15*b* and excessive pressure is applied to the vibrating electrode film 15, the penetration of the pressure release hole 15*b* by the protruding section 17*b* is canceled and the entire pressure release hole 15*b* is exposed.

In contrast, in the fourth embodiment, an example will be described in which: a protruding section penetrates through a pressure release hole of a vibrating electrode film to close the pressure release hole; a diameter of the protruding section is smaller on a tip side than on a back plate side; and when excessive pressure is applied to the vibrating electrode film, a change in a portion penetrating through the pressure release hole of the protruding section causes an area where the pressure release hole is closed to change and, accordingly, a flow channel area of a pressure releasing flow channel changes.

Figure 13A:
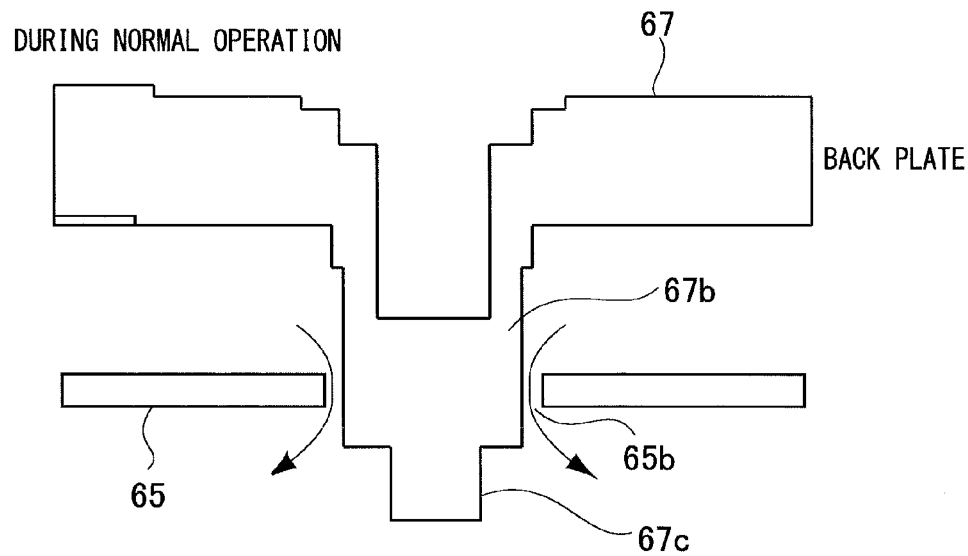
FIGS. 13A-13B are schematic views of a vicinity of a vibrating electrode film and a back plate of an acoustic sensor according to a fourth embodiment of the present invention.
Figure 13B:
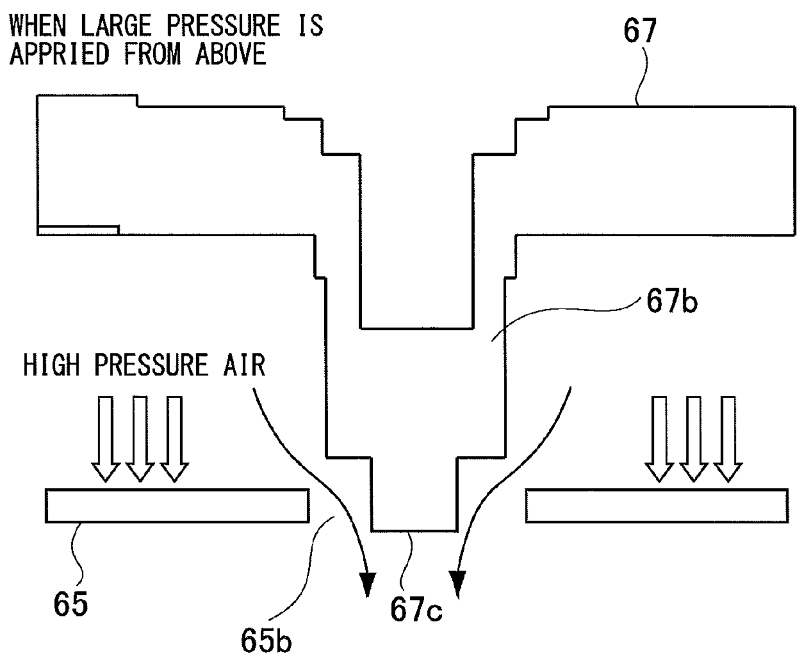

FIGS. 13A and 13B show schematic views of a vicinity of a vibrating electrode film 65 and a back plate 67 of an acoustic sensor according to the present embodiment. As shown in FIGS. 13A-13B, in the present embodiment, the vibrating electrode film 65 is provided with a pressure release hole 65*b*. In addition, the back plate 67 is provided with a protruding section 67*b* which is a pillar structure integrally provided in a protruding shape. Furthermore, a diameter of the protruding section 67*b* discontinuously decreases in a vicinity of a tip thereof to form a protruding section tip section 67*c*. In addition, a construction is adopted in which, in a state prior to excessive pressure being applied to the vibrating electrode film 65, the protruding section 67*b* penetrates through the pressure release hole 65*b* to close the pressure release hole 65*b*.

FIG. 13A shows a state prior to a significant deformation of the vibrating electrode film 65. FIG. 13B shows a state where, due to the application of excessive pressure on the vibrating electrode film 65, the vibrating electrode film 65 has deformed significantly. As shown in FIG. 13A, in the state prior to deformation of the vibrating electrode film 65, a state is created where a large-diameter portion of the protruding section 67*b* of the back plate 67 penetrates through the pressure release hole 65*b* provided in the vibrating electrode film 65 and closes the pressure release hole 65*b*. In this state, when pressure is applied to the vibrating electrode film 65 from the side of the back plate 67, a flow channel area of a flow channel which passes through the pressure release hole 65*b* is small and pressure is not sufficiently released.

However, when excessive pressure is applied to the vibrating electrode film 65, the pressure causes the vibrating electrode film 65 to deform significantly in a direction of separation from the back plate 67 as shown in FIG. 13B. As a result, a state is created where the large-diameter section of the protruding section 67*b* withdraws from the pressure release hole 65*b* and the protruding section tip section 67*c* with a small diameter penetrates through the pressure release hole 65*b*. Accordingly, an area of a portion not closed by the protruding section 67*b* in the pressure release hole 65*b* increases. As a result, deformation of the vibrating electrode film 65 is suppressed and damage to the vibrating electrode film 65 can be avoided.

As described above, in the present embodiment, during normal operation or, in other words, in a state where the vibrating electrode film 65 has not significantly deformed due to excessive pressure, since the protruding section 67*b* penetrates through and closes the pressure release hole 65*b*, deterioration of frequency characteristics of the acoustic sensor can be suppressed. In addition, in a state where excessive pressure is applied to the vibrating electrode film 65 and the vibrating electrode film 65 has deformed significantly, since a state where the small-diameter protruding section tip section 67*c* of the protruding section 67*b* penetrates through the pressure release hole 65*b* is created and a flow channel area of air for releasing pressure increases, a further deformation of the vibrating electrode film 65 can be suppressed. As a result, damage to the vibrating electrode film 65 caused when excessive pressure is applied to the acoustic sensor can be avoided.

Figure 14A:
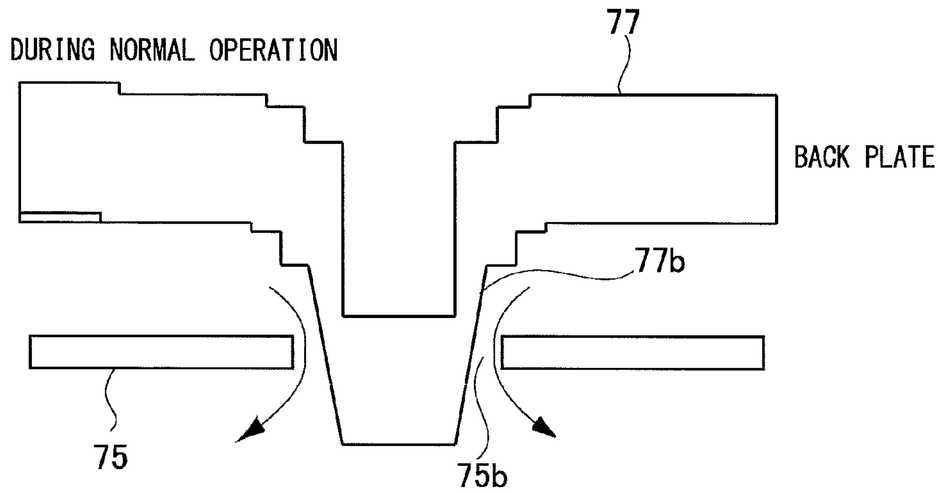
FIGS. 14A-14B are schematic views showing another example of a vicinity of a vibrating electrode film and a back plate of the acoustic sensor according to the fourth embodiment of the present invention.
Figure 14B:
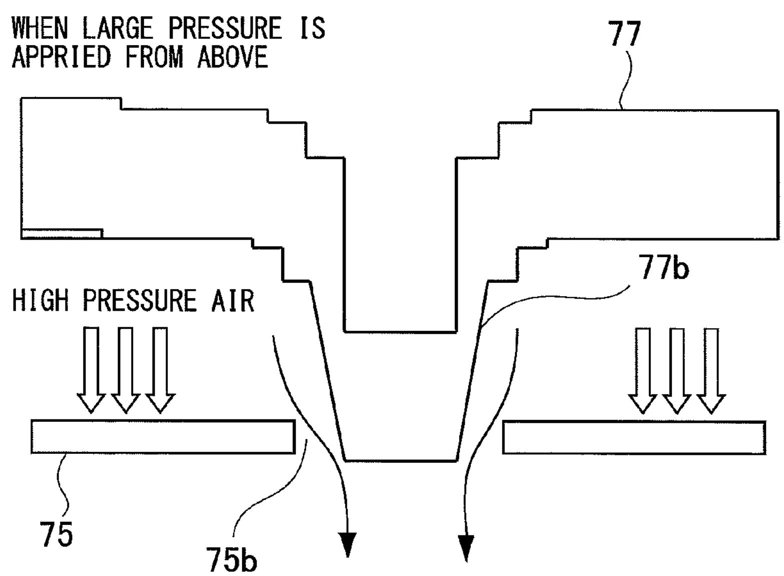

Moreover, while the description of the present embodiment given above is premised on the diameter of the protruding section 67*b* changing in two steps, the manner in which the diameter of the protruding section changes is not limited thereto. FIGS. 14A-14B illustrate examples in which a diameter of a protruding section 77*b* changes linearly in a stepless manner such that, the closer to a tip of the protruding section 77*b*, the smaller the diameter. Even in this case, in a state where excessive pressure is applied to a vibrating electrode film 75 and the vibrating electrode film 75 has deformed significantly, since a state where a small-diameter portion on a side of the tip of the protruding section 77*b* penetrates through a pressure release hole 75*b* is created and a flow channel area of air for releasing pressure increases, a further deformation of the vibrating electrode film 75 can be suppressed.

Moreover, in the present embodiment, the gaps between the protruding sections 67*b* and 77*b* or the protruding section tip section 67*c* and peripheral sections of the pressure release holes 65*b* and 75*b* correspond to a pressure releasing flow channel. In addition, the protruding sections 67*b* and 77*b* and the protruding section tip section 67*c* correspond to the protruding portion and to the protruding pillar structure.

Moreover, in all of the embodiments described above, the flow channel area signifies a sectional area of a flow channel which dictates a flow rate of air passing through the flow channel. In addition, in the embodiment described above, the protruding section of the back plate may be formed at any position of the back plate. However, the protruding section is desirably provided in a region outside of the stationary electrode film provided on the back plate.

Accordingly, the protruding section can be formed without reducing an area of the stationary electrode film and sensitivity of the acoustic sensor can be secured. Alternatively, instead of arranging the protruding section in a peripheral section of the back plate, the protruding section may be provided at a position of the back plate which corresponds to a central section of the vibrating electrode film and the pressure release hole may be provided in the central section of the vibrating electrode film. According to this configuration, since pressure can be released at a location where the vibrating electrode film has a largest amount of displacement, sensitivity when releasing pressure can be improved. In addition, cross-sectional shapes of the protruding section and the pressure release hole need not be circular and may be elliptical or polygonal. Furthermore, the numbers of the protruding section and the pressure release hole are not particularly limited. There may be only one set or a plurality of sets such as five sets or more may be provided.

In addition, with respect to the acoustic sensor according to the embodiment described above, a mode in which a vibrating electrode film is arranged on a silicon substrate and a back plate is arranged on the vibrating electrode film has been described. However, an acoustic sensor to which the present invention is applied is not limited to this mode. The present invention may be applied to an acoustic sensor configured such that arrangements of the back plate and the vibrating electrode film are reversed.

Fifth Embodiment

Next, a fifth embodiment of the present invention will be described. In the present embodiment, an example in which a protruding section particularly has a shallow pan-like structure with a flat bottom surface will be described.

Figure 15:
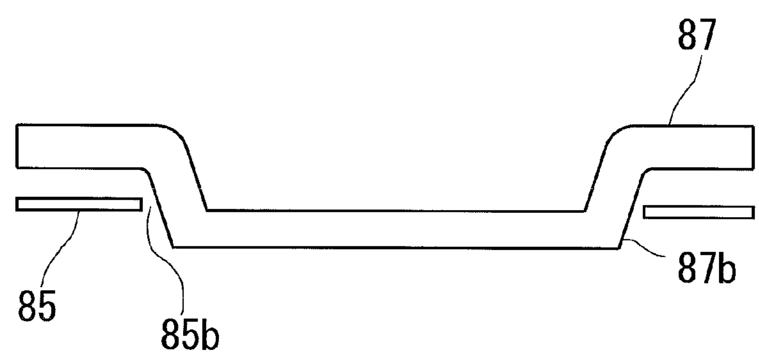
FIG. 15 is a schematic view showing a configuration of a vicinity of a vibrating electrode film and a protruding section of a back plate of an acoustic sensor according to a fifth embodiment of the present invention.

FIG. 15 shows a schematic view of a vicinity of a vibrating electrode film 85 and, particularly, a protruding section 87*b* of a back plate 87 of an acoustic sensor according to the present embodiment. As shown in FIG. 15, the protruding section 87*b* according to the present embodiment has a smaller height-to-diameter ratio than the protruding section 77*b* shown in FIGS. 14A and 14B and an approximate outer shape of the protruding section 87*b* is an approximate truncated conic shape with a tapered side surface in which, the closer to a tip side, the smaller the diameter.

By shaping the protruding section 87*b* as described above, a difference in level of the protruding section 87*b* from the back plate 87 can be suppressed and an inclination angle on the tapered side surface can be made gradual. According to this configuration, stress concentration at the level difference can be suppressed and strength of the protruding section 87*b* can be relatively increased. In addition, when depositing and forming the protruding section 87*b* by a semiconductor manufacturing process, film quality itself of the side surface can be improved, which also contributes to increasing strength of the protruding section 87*b*.

Specifically, for example, when the side surface of the protruding section 87*b* is vertically formed, a decline in a state of film formation particularly at the bottom of the protruding section 87*b* and a reduction in film thickness of a film forming the bottom section may cause a decline in strength. From these perspectives, a slope angle of the side surface of the protruding section 87*b* is desirably 60 degrees or more and 85 degrees or less with respect to a plane of the back plate. In particular, when a pressure release hole 85*b* formed in the vibrating electrode film 85 has a large diameter of several μm or more, it is known that a state of the protruding section 87*b* becomes particularly stable by forming the side surface of the protruding section 87*b* as a tapered surface.

In addition, according to the present embodiment, as the vibrating electrode film 85 deforms downward and the protruding section 87*b* moves in a direction of withdrawal from the pressure release hole 85*b*, a gap between the protruding section 87*b* and an end surface of the pressure release hole 85*b* widens. Therefore, there is an advantage that foreign objects having infiltrated between the vibrating electrode film 85 and the back plate 87 are removed from the gap and a probability of foreign objects becoming deposited or getting caught in the vicinity of the protruding section 87*b* is reduced. Moreover, a diameter of the protruding section 87*b* can be selected in accordance with specifications from a range of 2 μm or more and 100 μm or less. As an example, FIG. 15 shows a state where a ratio between an amount of protrusion of the protruding section 87*b* from the back plate 87 and a diameter of the tip of the protruding section 87*b* is set to approximately 6:1.

Sixth Embodiment

Next, a sixth embodiment of the present invention will be described. In the present embodiment, variations in the number of sets of a pressure release hole provided on a vibrating electrode film and a protruding section provided on a back plate, and characteristics of the variations, will be explained.

Figure 16A:
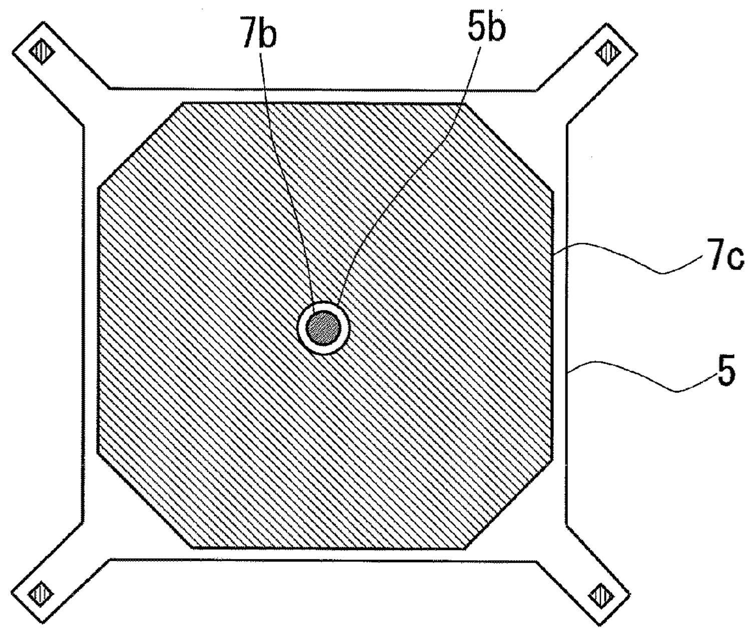
FIGS. 16A-16B are plan views of a vibrating electrode film and a back plate of an acoustic sensor according to a sixth embodiment when the vibrating electrode film and the back plate are provided with one and four pairs of a pressure release hole and a protruding section.

FIG. 16A shows a plan view of a vibrating electrode film 5 and a stationary electrode film 7*c* of a back plate of an acoustic sensor such as that shown in FIGS. 4A and 4B when the vibrating electrode film 5 and the back plate are provided with one pair of a pressure release hole 5*b* and a protruding section 7*b*. In the present embodiment, the pair of the pressure release hole 5*b* and the protruding section 7*b* is formed in central sections of the vibrating electrode film 5 and the stationary electrode film 7*c*. Advantages of this configuration include: (1) since there is only one pair of the pressure release hole 5*b* and the protruding section 7*b* which may affect frequency characteristics, there is less variation in frequency characteristics as an acoustic sensor; (2) since the pressure release hole 5*b* and the protruding section 7*b* are only formed in the central section where the amount of displacement of the vibrating electrode film 5 is large, the protruding section 7*b* is more readily withdrawn from the pressure release hole 5*b* and the pressure releasing function by the pressure release hole 5*b* and the protruding section 7*b* can even be exhibited under low pressure; (3) even when a (silicon) substrate 3 overlaps with the vibrating electrode film 5 and the back plate in a plan view, a distance between a center-side end surface of the substrate 3 and the pressure release hole 5*b* and the protruding section 7*b* can be increased and an effect of overlapping can be suppressed; and the like.

On the other hand, disadvantages when providing one pair of the pressure release hole 5*b* and the protruding section 7*b* include: since an area of the pressure release hole 5*b* in the vibrating electrode film 5 as a whole is small even in a state where the protruding section 7*b* has withdrawn from the pressure release hole 5*b*, air pressure resistance is relatively low.

Generally, since a vibrating electrode film is often fixed at end sections (in a case of a rectangular shape, four corners), this configuration enables a pressure release hole and a protruding section to be formed in a portion in which an amount of displacement of the vibrating electrode film is large regardless of the shape of the vibrating electrode film. As a result, a pressure releasing function can be exhibited with greater sensitivity or higher reliability.

Figure 16B:
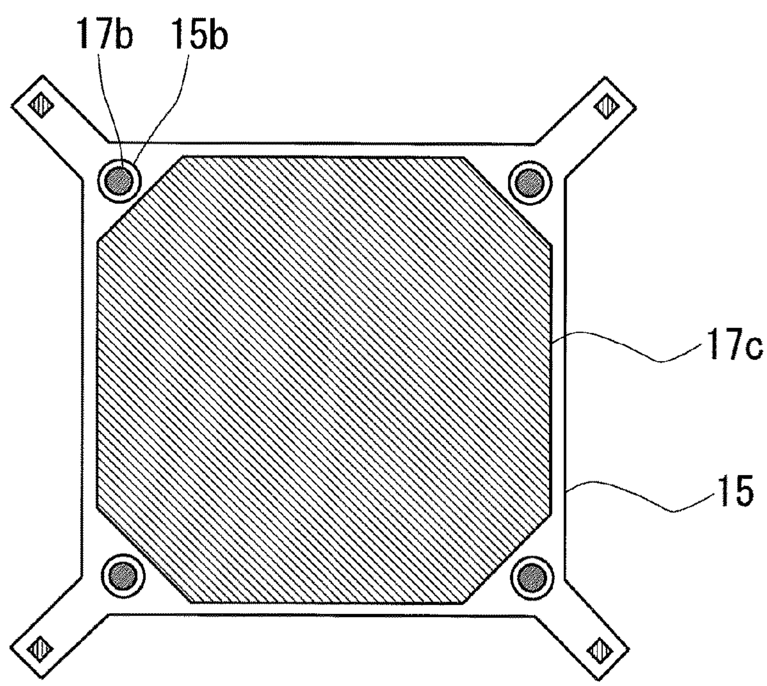

Next, FIG. 16B shows a plan view of a vibrating electrode film 15 and a stationary electrode film 17*c* of a back plate of an acoustic sensor such as that shown in FIGS. 5A and 5B when the vibrating electrode film 15 and the back plate are provided with four pairs of a pressure release hole 15*b* and a protruding section 17*b*. In the present embodiment, the pairs of the pressure release hole 15*b* and the protruding section 17*b* are formed in a vicinity of fixing sections at four corners of the vibrating electrode film 15. Advantages of this configuration include: (1) since the pairs of the pressure release hole 15*b* and the protruding section 17*b* are arranged on an outer side of the stationary electrode film 17*c* of the back plate, an area of the stationary electrode film 17*c* of the back plate is not reduced and acoustic performance of the acoustic sensor is hardly affected; (2) since the pressure release holes 15*b* and the protruding sections 17*b* are formed only in portions which are close to the fixing sections and which have a small amount of displacement in the vibrating electrode film 15, the protruding sections 17*b* are relatively less likely to withdraw from the pressure release holes 15*b* and frequency characteristics can be maintained up to high sound pressure (advantageous to use under high sound pressure); (3) a balance can be achieved between air pressure resistance and frequency characteristics and a degree of freedom of design can be increased; and the like.

Figure 17A:
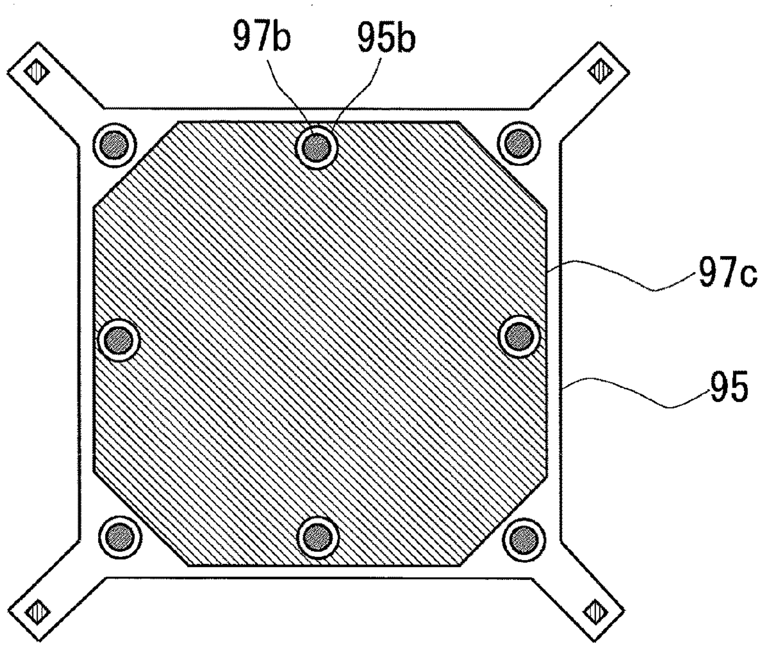
FIGS. 17A-17B are plan views of a vibrating electrode film and a back plate of the acoustic sensor according to the sixth embodiment when the vibrating electrode film and the back plate are provided with eight and nine pairs of a pressure release hole and a protruding section.

Next, FIG. 17A shows a plan view of a vibrating electrode film 95 and a stationary electrode film 97*c* of a back plate of an acoustic sensor when the vibrating electrode film 95 and the back plate are provided with eight pairs of a pressure release hole 95*b* and a protruding section 97*b*. In the present embodiment, the pairs of the pressure release hole 95*b* and the protruding section 97*b* are formed in a vicinity of fixing sections at four corners as well as at central sections of four sides of the vibrating electrode film 95. Advantages of this configuration in comparison to the case shown in FIG. 16B in which four pairs of the pressure release hole 15*b* and the protruding section 17*b* are provided include: (1) since a large area of the pressure release hole 95*b* in the vibrating electrode film 95 as a whole is secured in a state where all of the protruding sections 97*b* have withdrawn from the pressure release holes 95*b*, air pressure resistance improves significantly; (2) in addition, since the protruding sections 97*b* do not withdraw from the pressure release holes 95*b* until large pressure is applied, frequency characteristics can be maintained even under high sound pressure (further advantageous to use under high sound pressure); (3) when the number of the protruding sections 97*b* increases, a deflection of the back plate may change and, in particular, the deflection of the back plate may change significantly in a central section of the back plate due to large distances from the fixing sections. However, by arranging the pairs of the pressure release hole 95*b* and the protruding section 97*b* so as to avoid central sections of the vibrating electrode film 95 and the back plate as in this mode, warpage deformation of the back plate can be reduced; (4) an area of the stationary electrode film 97*c* on the back plate in a portion where the amount of displacement of the vibrating electrode film 95 is large is not reduced and acoustic performance of the acoustic sensor is hardly affected; and the like. However, disadvantages include (1) an increase in variations in frequency characteristics.

Figure 17B:
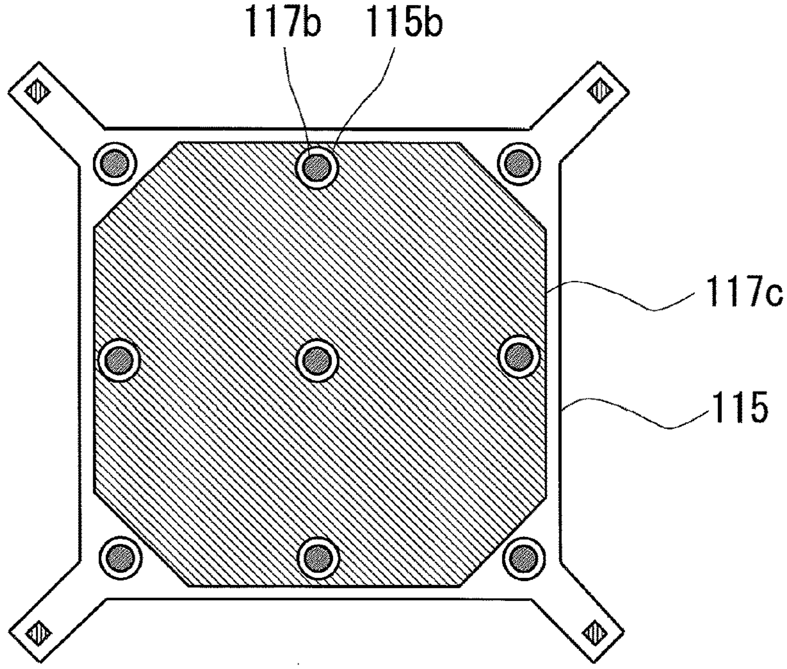

FIG. 17B shows a plan view of a vibrating electrode film 115 and a stationary electrode film 117*c* of a back plate of an acoustic sensor when the vibrating electrode film 115 and the back plate are provided with nine pairs of a pressure release hole 115*b* and a protruding section 117*b*. In the present embodiment, the pairs of the pressure release hole 115*b* and the protruding section 117*b* are formed at a central section, in a vicinity of fixing sections at four corners, and at central sections of four sides of the vibrating electrode film 115. Advantages of this configuration in comparison to the case shown in FIG. 17A in which eight pairs of the pressure release hole 95*b* and the protruding section 97*b* are provided further include: (1) air pressure resistance improves; (2) since the protruding sections 117*b* do not withdraw from the pressure release holes 115*b* until large pressure is applied, frequency characteristics can be maintained even under high sound pressure (advantageous to use under high sound pressure). On the other hand, disadvantages include (1) when the number of the protruding sections 117*b* increases, a deflection of the back plate may change and the back plate may become susceptible to sticking; (2) variations in frequency characteristics increase; and the like.

Moreover, since the pairs of the pressure release hole and the protruding section are arranged symmetrical with respect to the central section of the back plate in all of the four examples shown in FIGS. 16A-16B and 17A-17B, an effect of stabilizing stress dispersion and spring behavior of the vibrating film are obtained. For example, in the case where eight pairs of the pressure release hole 95*b* and the protruding section 97*b* are provided and the case where nine pairs of the pressure release hole 115*b* and the protruding section 117*b* are provided as shown in FIGS. 17A and 17B, eight-fold symmetry (symmetrical every 45 degrees) is created and arrangements of the pairs of the pressure release hole and the protruding section are equivalent in every direction. As a result, a displacement of a vibrating film is made uniform when receiving a sonic wave or external pressure, which contributes to improvements in strength and sensitivity.

In addition, when the protruding section withdraws from the pressure release hole to release air, air present in the periphery of each pressure release hole translationally moves toward the pressure release hole and subsequently reaches an opposite side of the vibrating electrode film through the pressure release hole. Therefore, according to the present embodiment, arranging the pairs of the pressure release hole and the protruding section as far away as possible from each other enables a larger amount of air as a whole to be released from the pressure release holes and enables pressure to be released more efficiently. Conversely, when the pairs of the pressure release hole and the protruding section are close to each other, since the pressure release hole of a single pair is only capable of releasing air in a nearby region, only a limited amount of air can be released and efficiency of releasing pressure declines. The arrangements of the pairs of the pressure release hole and the protruding section according to the present embodiment represent, for each number of pairs, an example of an arrangement in which the pairs are as far away as possible from each other.

Seventh Embodiment

Next, a seventh embodiment of the present invention will be described. In the present embodiment, an example will be described which adopts measures against foreign objects involving increasing a gap in a thickness direction between a back plate and a vibrating electrode film in a periphery of a protruding section of the back plate.

Foreign objects may infiltrate a space between a back plate and a vibrating electrode film in an acoustic sensor through sound holes. When foreign objects infiltrate into the acoustic sensor, the foreign objects may become deposited or may get caught between a protruding section of the back plate and a pressure release hole of the vibrating electrode film in accordance with air flow. As a result, due to a change in a gap between the back plate and the vibrating electrode film, frequency characteristics of the acoustic sensor may become affected. In addition, while such situations may conceivably be addressed by increasing a basic gap between the back plate and the vibrating electrode film, such a measure may cause sensitivity as a condenser microphone to decline. In consideration thereof, in the present embodiment, by increasing the gap between the back plate and the vibrating electrode film only in a periphery of a protruding section of the back plate, even when foreign objects infiltrate in a vicinity of the protruding section and a pressure release hole, an effect on the gap between the back plate and the vibrating electrode film is reduced.

Figure 18:
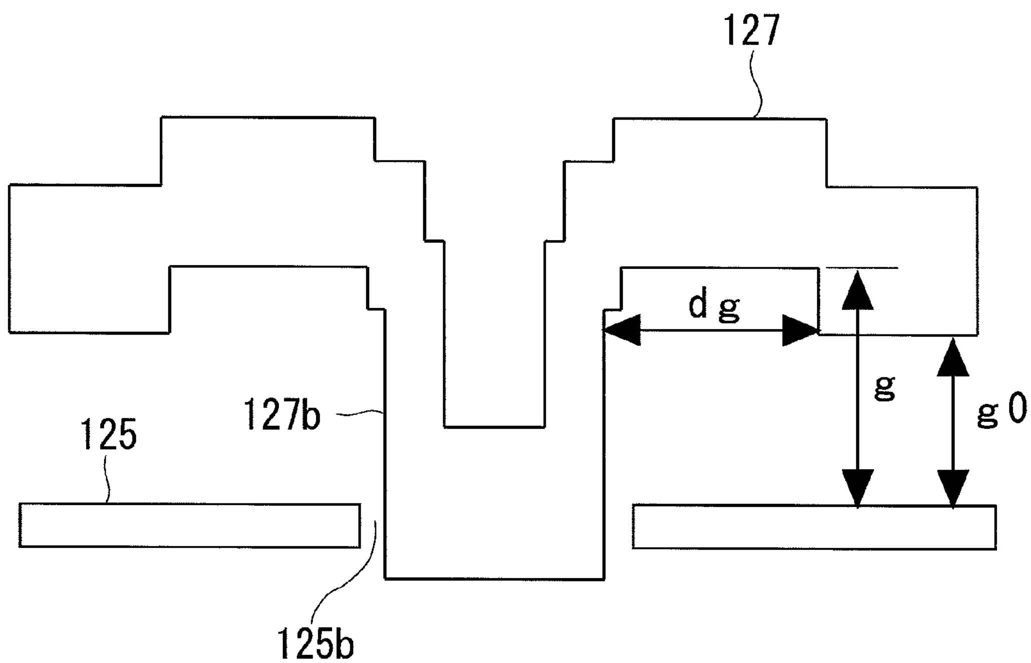
FIG. 18 is a sectional view showing a vicinity of a pair of a protruding section provided on a back plate and a pressure release hole provided on a vibrating electrode film according to a seventh embodiment.

FIG. 18 is a sectional view showing a vicinity of a pair of a protruding section 127*b* provided on a back plate 127 and a pressure release hole 125*b* provided on a vibrating electrode film 125 according to the present embodiment. In the present embodiment, a gap between the back plate 127 and the vibrating electrode film 125 is set to g0 in a region distanced from the protruding section 127*b* and set to g (>g0) in a region near the protruding section 127*b*. As a result, even when foreign objects become deposited or get caught in a vicinity of the protruding section 127*b* of the back plate 127 and the pressure release hole 125*b* of the vibrating electrode film 125, an amount of change of the gap between the back plate 127 and the vibrating electrode film 125 can be reduced and an effect on the frequency characteristics of the acoustic sensor can be reduced.

Figure 19A:
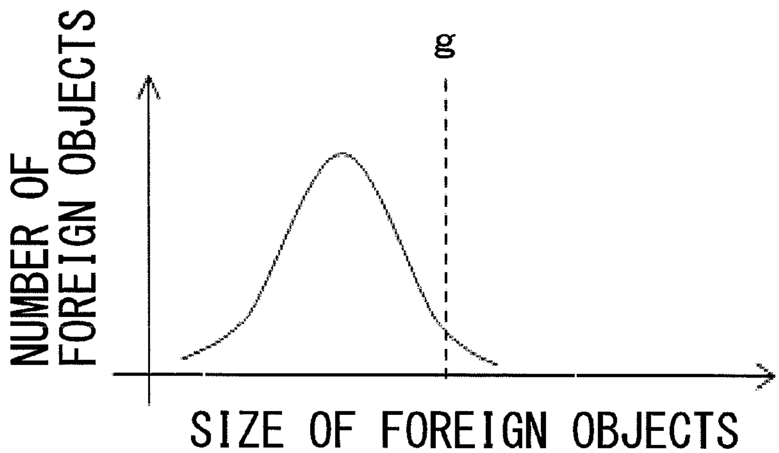
FIGS. 19A-19B are graphs with a distribution of sizes of foreign objects on an abscissa thereof and a distribution of the number of the foreign objects on an ordinate thereof.
Figure 19B:
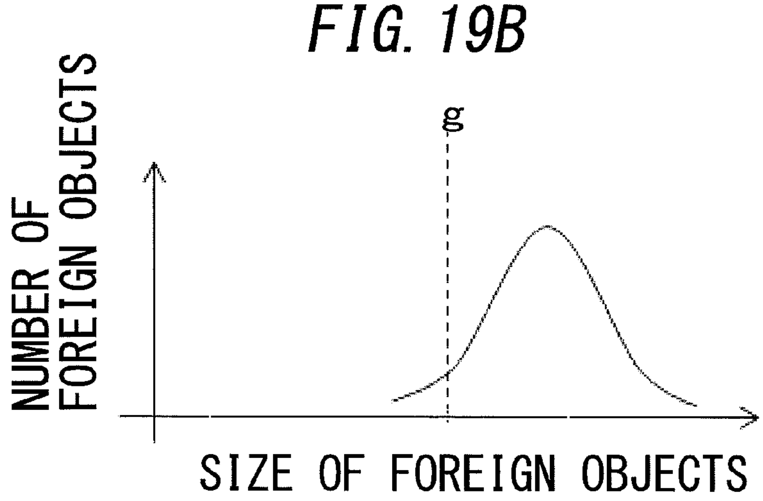

Next, an effect produced by the acoustic sensor according to the present embodiment will be described with reference to FIGS. 19A and 19B. FIGS. 19A-19B are graphs with sizes (diameters) of foreign objects on an abscissa thereof and the number of the foreign objects on an ordinate thereof. FIG. 19A shows a case where a major portion of a distribution of the sizes of foreign objects is smaller than the size g of the gap between the back plate 127 and the vibrating electrode film 125 in a region near the protruding section 127*b*, and FIG. 19B shows a case where a major portion of the distribution of the sizes of foreign objects is larger than the size g of the gap between the back plate 127 and the vibrating electrode film 125 in a region near the protruding section 127*b*. As shown in FIG. 19A, when a major portion of the distribution of the sizes of foreign objects is smaller than the size g of the gap between the back plate 127 and the vibrating electrode film 125 in a region near the protruding section 127*b*, a displacement of the vibrating electrode film 125 caused by deposition of the foreign objects can be reduced by setting the gap to g (>g0) in the region near the protruding section 127*b* and an effect on sensitivity of the acoustic sensor can be reduced.

In addition, even when a major portion of the distribution of the sizes of foreign objects is larger than the size g of the gap between the back plate 127 and the vibrating electrode film 125 in a region near the protruding section 127*b* as shown in FIG. 19B, an upper limit of diameters of the foreign objects deposited or caught in the vicinity of the protruding section 127*b* of the back plate 127 and the pressure release hole 125*b* of the vibrating electrode film 125 is actually limited to approximately g0. Therefore, even in this case, an effect similar to the case shown in FIG. 19A can be expected and, conversely, it is conceivable that adverse effects such as foreign objects getting trapped in a portion where the gap has been widened may not occur.

Moreover, in the present embodiment, while a range in which the gap between the back plate 127 and the vibrating electrode film 125 is widened is desirably as small as possible in consideration of sensitivity as an acoustic sensor, a distance dg from a side surface of the protruding section 127*b* may be set to a range expressed as $0 \leq dg \leq g$ in consideration of a particle size of the foreign objects. Alternatively, a wider range may be adopted.

Eighth Embodiment

Next, an eighth embodiment of the present invention will be described. In the present embodiment, an example will be described which adopts measures against foreign objects involving reducing an area ratio of sound holes in a periphery of a protruding section of a back plate.

A state where foreign objects infiltrate inside an acoustic sensor and become deposited or get caught between a protruding section of a back plate and a pressure release hole of a vibrating electrode film is conceivably more likely to occur when the foreign objects enter from sound holes in a vicinity of the protruding section of the back plate. Therefore, a measure of not providing sound holes in a vicinity of the protruding section of the back plate is conceivable.

However, since the sound holes of the back plate may be used as chemical insertion ports in etching of a sacrificial layer during a semiconductor process and are also necessary in order to reduce thermal noise in an air gap, eliminating the sound holes altogether is not feasible. In consideration thereof, the present embodiment adopts measures against foreign objects involving reducing an area ratio of sound holes in a vicinity of the protruding section of the back plate.

Figure 20A:
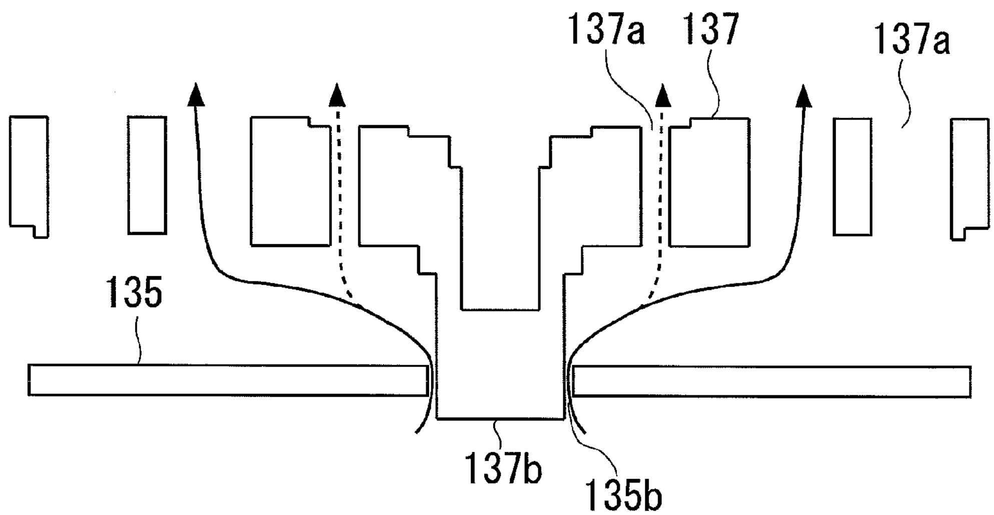
FIGS. 20A-20B are sectional views showing a state of a periphery of a sound hole and a protruding section provided on a back plate and a pressure release hole provided on a vibrating electrode film according to an eighth embodiment.
Figure 20B:
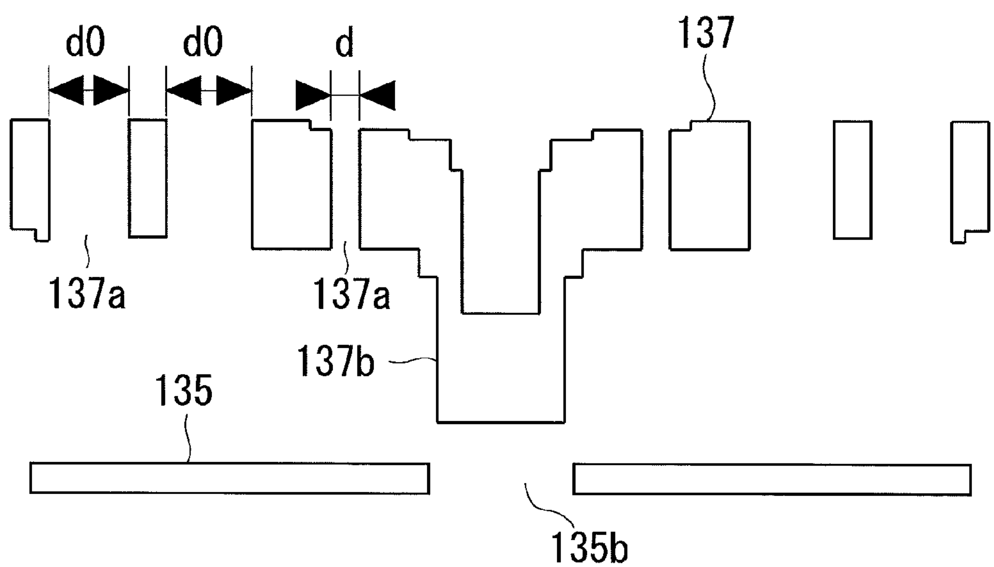

FIGS. 20A and 20B are sectional views showing a state of a periphery of sound holes 137*a* and a protruding section 137*b* provided on a back plate 137 and a pressure release hole 135*b* provided on a vibrating electrode film 135 according to the present embodiment. FIG. 20A shows a state where the protruding section 137*b* has not withdrawn from the pressure release hole 135*b* and FIG. 20B shows a state where the protruding section 137*b* has withdrawn from the pressure release hole 135*b* when subjected to large pressure.

In the present embodiment, as shown in FIG. 20B, a diameter of the sound holes 137*a* in the back plate 137 is set to d0 in a region distanced from the protruding section 137*b* and set to d (<d0) in a region near the protruding section 137*b*. According to this configuration, a probability of infiltration by foreign objects from the sound holes 137*a* in the vicinity of the protruding section 137*b* of the back plate 137 can be reduced and a probability of foreign objects becoming deposited or getting caught in the vicinity of the protruding section 137*b* of the back plate 137 and the pressure release hole 135*b* of the vibrating electrode film 135 can be reduced.

In the present embodiment, as shown in FIG. 20A, acoustic resistance (passage resistance of air) which determines frequency characteristics of an acoustic sensor is a sum of acoustic resistance in a gap between a side surface of the protruding section 137*b* of the back plate 137 and the pressure release hole 135*b* of the vibrating electrode film 135 and acoustic resistance in the sound holes 137*a*. Therefore, when the diameter of the sound holes 135*a* in the vicinity of the protruding section 137*b* is reduced as in the present embodiment, total acoustic resistance in this region increases. As a result, in the present embodiment, a secondary effect is produced in which, even when the gap between the side surface of the protruding section 137*b* of the back plate 137 and the pressure release hole 135*b* of the vibrating electrode film 135 varies, an effect on total acoustic resistance can be relatively reduced.

Moreover, while the area ratio of sound holes is reduced in the present embodiment by reducing a diameter of the sound holes 137*a* in a region near the protruding section 137*b* in comparison to regions distanced from the protruding section 137*b*, for example, the area ratio of sound holes may be reduced by increasing distances between sound holes 137*a* (reducing a density of sound holes 137*a*) in a region near the protruding section 137*b* in comparison to regions distanced from the protruding section 137*b*.

In addition, in the present embodiment, a range in which the area ratio of the sound holes 137*a* is reduced in the back plate 137 may be, for example, a range in which a distance from the side surface of the protruding section 137*b* is equal to or less than twice the diameter of the protruding section 137*b*. Alternatively, a wider range may be adopted.

Ninth Embodiment

Next, a ninth embodiment of the present invention will be described. In the present embodiment, an example will be described in which measures against foreign objects involve adopting a configuration in which a sound hole in a periphery of a protruding section of a back plate and a pressure release hole of a vibrating electrode film overlap with each other in a plan view.

Figure 21:
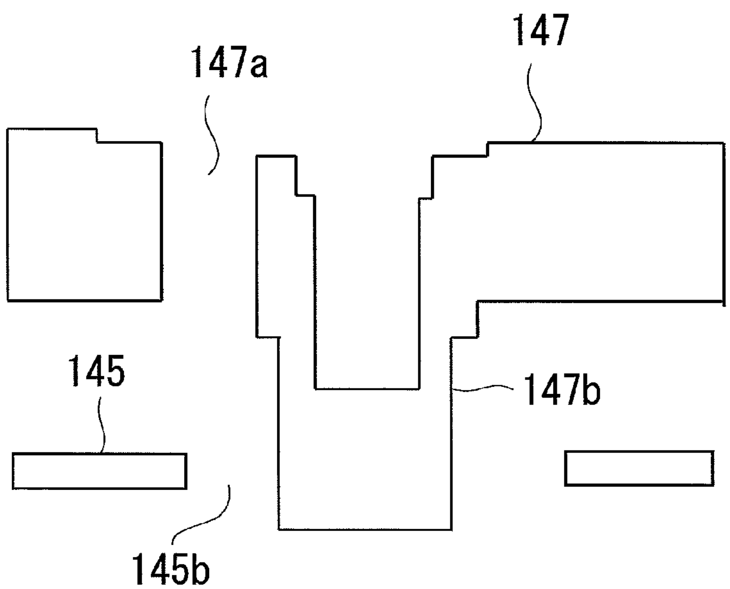
FIG. 21 is a sectional view showing a positional relationship among a sound hole and a protruding section of a back plate and a pressure release hole of a vibrating electrode film according to a ninth embodiment.

FIG. 21 is a sectional view showing a positional relationship among a sound hole 147*a* and a protruding section 147*b* in a back plate 147 and a pressure release hole 145*b* in a vibrating electrode film 145 according to the present embodiment.

In the present embodiment, as shown in FIG. 21, positions in a horizontal direction of the sound hole 147*a* in the back plate 147 and the pressure release hole 145*b* overlap with each other. In other words, a state is created in which the sound hole 145*a* opens in a part directly above a gap between the protruding section 147*b* and the pressure release hole 145*b*. According to this configuration, since a space penetrating through both the vibrating electrode film 145 and the back plate 147 can be formed and foreign objects can readily pass through this space, a probability of foreign objects becoming deposited or getting caught in the vicinity of the protruding section 147*b* of the back plate 147 and the pressure release hole 145*b* of the vibrating electrode film 145 can be reduced.

As shown in the present embodiment, by forming a space penetrating through both the vibrating electrode film 145 and the back plate 147, an increase in attenuation of sensitivity of an acoustic sensor in a low-frequency region is expected and, at the same time, an improvement in a pressure releasing function when large pressure is applied and the protruding section 147*b* withdraws from the pressure release hole 145*b* is expected. Therefore, according to the present embodiment, in addition to enhancing measures against foreign objects, air pressure resistance can be improved while causing sensitivity of the acoustic sensor in a low-frequency region to attenuate at a constant level.

Other Considerations

Figure 22:
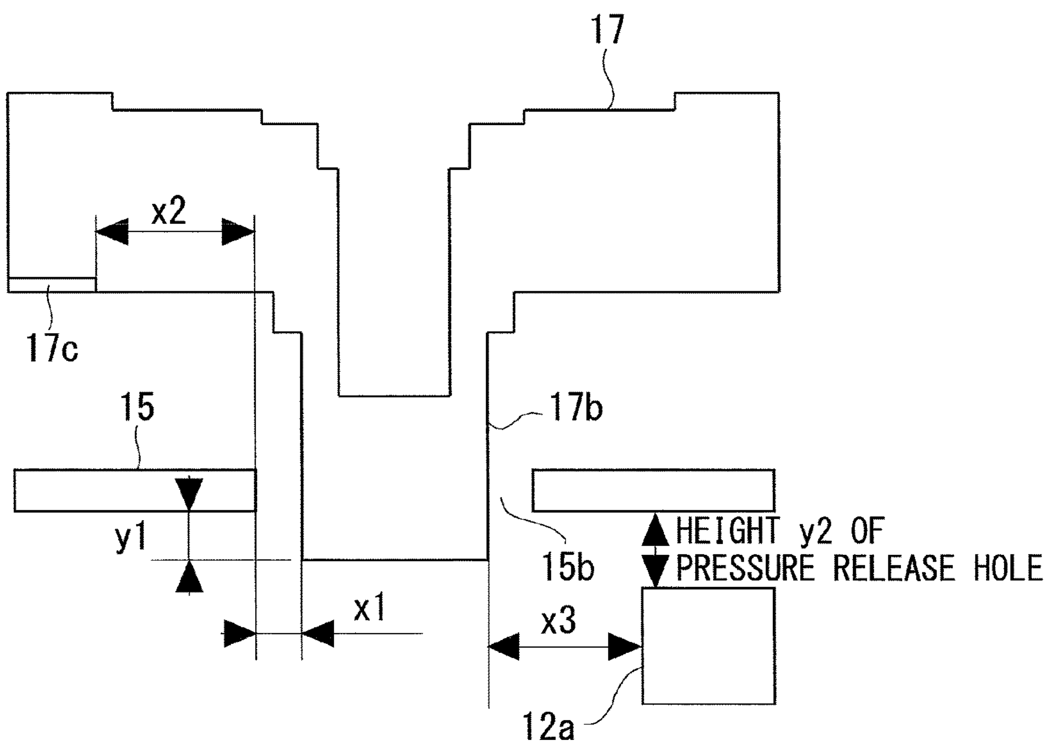
FIG. 22 is a diagram for explaining a dimensional relationship among respective parts in a vicinity of a protruding section of a back plate and a pressure release hole of a vibrating electrode film.

Next, a desirable state of dimensions of the respective parts according to the embodiments described above will be considered. FIG. 22 is a diagram for explaining a dimensional relationship among respective parts in a vicinity of the protruding section 17*b* of the back plate 17 and the pressure release hole 15*b* of the vibrating electrode film 15.

<Amount of Protrusion of Protruding Section from Vibrating Electrode Film>

In FIG. 22, generally, as an amount of protrusion y1 of a tip of the protruding section 17*b* from the vibrating electrode film 15 increases, there are advantages such as: (1) even when large sound pressure is applied, the protruding section 17*b* is less likely to withdraw from the pressure release hole 15*b* and impedes occurrences of FR and THD; and (2) tolerance of variations in arrangements of respective members with respect to a longitudinal direction of the protruding section 17*b* increases. On the other hand, there are disadvantages such as: (1) the protruding section 17*b* does not withdraw from the pressure release hole 15*b* unless relatively high pressure is applied and, depending on variations, there is a risk that the pressure releasing function may fail to operate in a necessary pressure range; and (2) when foreign objects are deposited between the back plate 17 and the vibrating electrode film 15 in a periphery of the protruding section 17*b*, deformation of the vibrating electrode film 15 increases and an effect of the foreign objects on frequency characteristics of the acoustic sensor becomes larger.

In addition, as the amount of protrusion of the tip of the protruding section 17*b* from the vibrating electrode film 15 decreases, there is an advantage that: (1) since the protruding section 17*b* withdraws from the pressure release hole 15*b* even when relatively low sound pressure is applied, deposition of foreign objects between the back plate 17 and the vibrating electrode film 15 in a periphery of the protruding section 17*b* can be suppressed even during use under relatively low sound pressure. On the other hand, there are disadvantages such as: (1) even when relatively low sound pressure is applied, the protruding section 17*b* withdraws from the pressure release hole 15*b* and an abnormality in acoustic characteristics may occur; and (2) tolerance of variations in arrangements of respective members with respect to a longitudinal direction of the protruding section 17*b* decreases. From these perspectives, an amount of protrusion of 0.1 μm or more and 10 μm or less described in the first embodiment conceivably represents appropriate values.

<Clearance Between Protruding Section of Back Plate and Pressure Release Hole of Vibrating Electrode Film>

In FIG. 22, when a clearance x1 between the protruding section 17*b* of the back plate 17 and the pressure release hole 15*b* of the vibrating electrode film 15 is narrow, there is an advantage that: (1) attenuation of frequency characteristics in a low-frequency range becomes gradual and better frequency characteristics are obtained. On the other hand, there are disadvantages such as: (1) a risk of the protruding section 17*b* and the pressure release hole 15*b* coming into contact with each other increases; and (2) tolerance of variations in dimensions with respect to a gap between the protruding section 17*b* and the pressure release hole 15*b* decreases. In consideration of the above, an appropriate value of the gap between the protruding section 17*b* and the pressure release hole 15*b* in the embodiments described above is 0.2 μm or more and 20 μm or less.

<Distance Between Protruding Section of Back Plate and Stationary Electrode Film>

In FIG. 22, when a distance ×2 between the protruding section 17*b* of the back plate 17 and the stationary electrode film 17*c* is small, there is an advantage that: (1) loss in an electrode area of the stationary electrode film 17*c* due to providing the protruding section 17*b* can be kept to small amount and a decline in sensitivity can be suppressed. On the other hand, there is a disadvantage that: (1) a risk of short-circuit increases when conductive foreign objects are deposited or get caught in the vicinity of the protruding section 17*b*. In consideration of the above, a distance between the protruding section 17*b* of the back plate 17 and the stationary electrode film 17*c* is appropriately set to 1 μm or more and 15 μm or less.

<Distance Between Protruding Section of Back Plate and Semiconductor Substrate Edge>

In FIG. 22, when a distance x1 between a silicon substrate edge 12*a* which overlaps with the back plate 17 and the vibrating electrode film 15 in a plan view and the protruding section 17*b* is long, there are advantages such as: (1) tolerance of variations in the distance x1 between the silicon substrate edge 12*a* and the protruding section 17*b* increases; and (2) a displacement of the vibrating electrode film 15 is less likely to be inhibited by the silicon substrate edge 12*a*. On the other hand, conceivably, there is no direct disadvantage. Since the vibrating electrode film 15 is at least displaceable by a height y2 of the pressure release hole 15*b* as long as the distance is greater than 0 μm, depending on design, a configuration producing an effective pressure releasing function can be realized. For example, the distance x3 described above may be set to 3 μm or more which represents a manufacturing variation of a position of the silicon substrate edge 12*a*.

REFERENCE SIGNS LIST

1 Acoustic sensor
2 Back chamber
3, 13 (Silicon) substrate
5, 15, 25, 35, 45, 55, 65, 75, 85, 95, 115, 125, 135, 145 Vibrating electrode film
7, 17, 27, 37, 47, 57, 67, 77, 87, 127, 137, 147 Back plate
7*c*, 17*c*, 97*c*, 117*c* Stationary electrode film
15*b*, 25*b*, 65*b*, 75*b*, 85*b*, 95*b*, 115*b*, 125*b*, 135*b*, 145*b* Pressure release hole
17*b*, 27*b*, 37*b*, 47*b*, 57*b*, 67*b*, 77*b*, 87*b*, 97*b*, 117*b*, 127*b*, 137*b*, 147*b* Protruding section

The invention claimed is:

1. A capacitance type transducer, comprising:

a substrate with an opening on a surface thereof;

a back plate arranged to oppose the opening of the substrate; and a vibrating electrode film arranged to oppose the back plate across a gap between the vibrating electrode film and the back plate, wherein the capacitance type transducer converting a displacement of the vibrating electrode film into a change in capacitance between the vibrating electrode film and the back plate, and wherein the capacitance type transducer further comprises a pressure releasing flow channel which is an air flow channel formed by a gap between a part of the vibrating electrode film and a protruding portion integrally provided on the back plate so as to penetrate into or cover a hole of the vibrating electrode film or so as to face towards an end surface of the vibrating electrode film and which is configured to, when the vibrating electrode film deforms under pressure, release the pressure applied to the vibrating electrode film by increasing a flow channel area due to a relative movement of the vibrating electrode film and the protruding portion integrally provided on the back plate.

2. The capacitance type transducer according to claim 1, wherein at least a part of a peripheral section of the back plate bends to form a side surface and the back plate is fixed to the substrate in a tip section of the side surface, the pressure releasing flow channel is formed by a gap between an end surface of the vibrating electrode film and a protruding portion integrally formed on the side surface of the back plate, and when the vibrating electrode film deforms under pressure, the pressure applied to the vibrating electrode film is released by increasing the gap between the end surface of the vibrating electrode film and the side surface of the back plate as the end surface of the vibrating electrode film and the protruding portion formed on the side surface of the back plate relatively move and deviate.

3. A capacitance type transducer, comprising:

a substrate with an opening on a surface thereof;

a back plate arranged to oppose the opening of the substrate; and a vibrating electrode film arranged to oppose the back plate across a gap between the vibrating electrode film and the back plate, wherein the capacitance type transducer converts a displacement of the vibrating electrode film into a change in capacitance between the vibrating electrode film and the back plate, wherein the capacitance type transducer further comprises a pressure releasing flow channel which is an air flow channel formed by a gap between a part of the vibrating electrode film and a protruding portion integrally provided on the back plate and which is configured to, when the vibrating electrode film deforms under pressure, release the pressure applied to the vibrating electrode film by increasing a flow channel area due to a relative movement of the vibrating electrode film and the protruding portion integrally provided on the back plate, wherein the protruding portion is a protruding pillar structure, wherein the pressure releasing flow channel is formed by a gap between a hole provided in the vibrating electrode film and a protruding pillar structure integrally provided from the back plate to a side of the vibrating electrode film, wherein at least a tip section of the protruding pillar structure has a smaller diameter than a diameter of the hole and the protruding pillar structure penetrates into the hole in a state prior to the vibrating electrode film deforming under pressure, and wherein, when the vibrating electrode film deforms under pressure, the pressure applied to the vibrating electrode film is released as the vibrating electrode film and the protruding pillar structure of the back plate relatively move and the penetration of the protruding pillar structure into the hole is canceled.

4. A capacitance type transducer, comprising:

a substrate with an opening on a surface thereof;

a back plate arranged to oppose the opening of the substrate; and a vibrating electrode film arranged to oppose the back plate across a gap between the vibrating electrode film and the back plate, wherein the capacitance type transducer converts a displacement of the vibrating electrode film into a change in capacitance between the vibrating electrode film and the back plate, wherein the capacitance type transducer further comprises a pressure releasing flow channel which is an air flow channel formed by a gap between a part of the vibrating electrode film and a protruding portion integrally provided on the back plate and which is configured to, when the vibrating electrode film deforms under pressure, release the pressure applied to the vibrating electrode film by increasing a flow channel area due to a relative movement of the vibrating electrode film and the protruding portion integrally provided on the back plate, wherein the protruding portion is a protruding pillar structure, wherein the pressure releasing flow channel is formed by a gap between a hole provided in the vibrating electrode film and a protruding pillar structure integrally provided from the back plate to a side of the vibrating electrode film, wherein the protruding pillar structure has a larger diameter than a diameter of the hole and a tip of the protruding pillar structure covers the hole from a side of the back plate in a state prior to the vibrating electrode film deforming under pressure, and wherein, when the vibrating electrode film deforms under pressure, the pressure applied to the vibrating electrode film is released as the vibrating electrode film and the protruding pillar structure of the back plate relatively move and the tip of the protruding pillar structure separates from the hole.

5. The capacitance type transducer according to claim 3, wherein in a state prior to the vibrating electrode film deforming under pressure, the protruding pillar structure penetrates through the hole and the tip of the protruding pillar structure is positioned on an opposite side of the vibrating electrode film to the back plate.

6. The capacitance type transducer according to claim 3, wherein a diameter of the protruding pillar structure either increases from the tip of the protruding pillar structure toward the back plate or is constant.

7. The capacitance type transducer according to claim 3, wherein the protruding pillar structure is formed by a same film forming process as that of the back plate.

8. The capacitance type transducer according to claim 1, wherein the vibrating electrode film is fixed to the substrate at an anchor section and the vibrating electrode film is not in contact with the substrate and the back plate at locations other than the anchor section.

9. The capacitance type transducer according to claim 1, wherein the back plate has a plurality of perforations.

10. The capacitance type transducer according to claim 3, wherein the substrate is arranged to avoid a portion opposing the protruding pillar structure integrally provided on the back plate.

11. The capacitance type transducer according to claim 3, wherein the back plate is arranged to oppose the substrate, and the protruding pillar structure is provided from the back plate toward a side of the substrate, and the tip of the protruding pillar structure is positioned on a same plane as a surface of the substrate on the back plate side or further toward the back plate side than the surface.

12. The capacitance type transducer according to claim 1, wherein the back plate has a stationary electrode film in a central section, and the protruding portion is provided on an outer side of the stationary electrode film on the back plate.

13. The capacitance type transducer according to claim 1, wherein the protruding portion is provided in a central section of the back plate.

14. The capacitance type transducer according to claim 6, wherein a side surface of the protruding pillar structure forms a tapered surface and an inclination angle of the tapered surface with respect to the back plate is set to 60 degrees or more and 85 degrees or less.

15. The capacitance type transducer according to claim 3, wherein the vibrating electrode film has an approximately rectangular shape and is fixed at fixing sections provided in four corners of the vibrating electrode film, and the protruding portion is provided at four locations in portions of the back plate which correspond to the four corners of the vibrating electrode film and to a further inner side than the fixing sections in a plan view.

16. The capacitance type transducer according to claim 13, wherein the protruding portion is provided at one location in a central section of the back plate.

17. The capacitance type transducer according to claim 15, wherein the protruding portion is further provided at four locations in portions of the back plate, which correspond to central sections of four sides of the vibrating electrode film in a plan view, so as to be provided at a total of eight locations.

18. The capacitance type transducer according to claim 17, wherein the protruding portion is further provided at one location in the central section of the back plate so as to be provided at a total of nine locations.

19. The capacitance type transducer according to claim 3, wherein in a state where the protruding pillar structure has penetrated into the hole before the vibrating electrode film deforms under pressure, the gap between the protruding pillar structure and the hole is set to 0.2 μm or more and 20 μm or less on one side.

20. The capacitance type transducer according to claim 3, wherein the back plate includes a stationary electrode film positioned to avoid a location where the protruding portion is provided in a plan view, and a distance between the protruding portion and the stationary electrode film is set to 1 μm or more and 15 μm or less.

21. The capacitance type transducer according to claim 3, wherein a size of the gap between the back plate and the vibrating electrode film is set larger within a prescribed range in a periphery of the protruding portion, as compared to outside of the prescribed range.

22. The capacitance type transducer according to claim 3, wherein a size of a sound hole in the back plate is set smaller within a prescribed range in a periphery of the protruding portion, as compared to outside of the prescribed range.

23. The capacitance type transducer according to claim 3, wherein a sound hole within a prescribed range in a periphery of the protruding portion of the back plate and a hole provided in the vibrating electrode film are arranged so that at least parts thereof overlap with each other in a plan view.

24. An acoustic sensor comprising the capacitance type transducer according to claim 1, wherein the acoustic sensor converts sound pressure into a change in capacitance between the vibrating electrode film and the back plate and detects the capacitance change.

25. An acoustic sensor comprising the capacitance type transducer according to claim 2, wherein the acoustic sensor converts sound pressure into a change in capacitance between the vibrating electrode film and the back plate and detects the capacitance change.

26. An acoustic sensor comprising the capacitance type transducer according to claim 3, wherein the acoustic sensor converts sound pressure into a change in capacitance between the vibrating electrode film and the back plate and detects the capacitance change.

27. An acoustic sensor comprising the capacitance type transducer according to claim 4, wherein the acoustic sensor converts sound pressure into a change in capacitance between the vibrating electrode film and the back plate and detects the capacitance change.

* * * * *